US009142516B2

(12) United States Patent
Takenaka et al.

(10) Patent No.: US 9,142,516 B2
(45) Date of Patent: Sep. 22, 2015

(54) SEMICONDUCTOR DEVICE AND MANUFACTURING METHOD THEREFOR

(75) Inventors: Masashi Takenaka, Tachikawa (JP); Katsuyoshi Yamamoto, Hachiouji (JP)

(73) Assignee: SOCIONEXT INC., Yokohama (JP)

( * ) Notice: Subject to any disclaimer, the term of this patent is extended or adjusted under 35 U.S.C. 154(b) by 126 days.

(21) Appl. No.: 13/525,719

(22) Filed: Jun. 18, 2012

(65) Prior Publication Data

US 2013/0026649 A1   Jan. 31, 2013

(30) Foreign Application Priority Data

Jul. 28, 2011   (JP) .................................. 2011-165227

(51) Int. Cl.
*H01L 23/498*   (2006.01)
*H01L 23/00*   (2006.01)
(Continued)

(52) U.S. Cl.
CPC ............ *H01L 24/03* (2013.01); *H01L 21/4853* (2013.01); *H01L 23/481* (2013.01); *H01L 23/49811* (2013.01); *H01L 23/49827* (2013.01); *H01L 24/05* (2013.01); *H01L 24/11* (2013.01); *H01L 24/13* (2013.01); *H01L 24/17* (2013.01); *H01L 24/81* (2013.01); *H01L 24/92* (2013.01); *H01L 25/0657* (2013.01); *H01L 24/14* (2013.01); *H01L 24/16* (2013.01); *H01L 24/94* (2013.01); *H01L 2224/02372* (2013.01); *H01L 2224/03* (2013.01); *H01L 2224/034* (2013.01); *H01L 2224/03614* (2013.01); *H01L 2224/0401* (2013.01); *H01L 2224/05009* (2013.01); *H01L 2224/05082* (2013.01); *H01L 2224/05083* (2013.01); *H01L 2224/05155* (2013.01); *H01L 2224/05171* (2013.01); *H01L 2224/05562* (2013.01); *H01L 2224/05564* (2013.01); *H01L 2224/05624* (2013.01); *H01L 2224/11* (2013.01); *H01L 2224/116* (2013.01);
(Continued)

(58) Field of Classification Search
CPC ....... H01L 23/498; H01L 23/88; H01L 21/50; H01L 21/60; H01L 23/48
See application file for complete search history.

(56) References Cited

U.S. PATENT DOCUMENTS 6,596,634 B2   7/2003   Umetsu et al.
6,812,549 B2   11/2004   Umetsu et al.
(Continued)

FOREIGN PATENT DOCUMENTS

JP   05-347327 A   12/1993
JP   10-294339 A   11/1998
(Continued)

OTHER PUBLICATIONS

Office Action dated Sep. 2, 2014, issued in corresponding Japanese Patent Application No. 2011-165227, with Partial English Translation (4 pages)

*Primary Examiner* — David Vu
*Assistant Examiner* — Mouloucoulaye Inoussa
(74) *Attorney, Agent, or Firm* — Westerman, Hattori, Daniels & Adrian, LLP

(57) ABSTRACT

A semiconductor device includes a plurality of protrusions formed on a first face of the semiconductor device; first bonding portions formed on upper portions of the plurality of protrusions; second bonding portions formed on side faces of the plurality of protrusions; and third bonding portions formed on the first face between the plurality of protrusions, wherein the semiconductor device is configured to bond to an other semiconductor device through the third from the first bonding portions.

5 Claims, 29 Drawing Sheets

(51) Int. Cl.
  *H01L 23/48* (2006.01)
  *H01L 21/48* (2006.01)
  *H01L 25/065* (2006.01)

(52) U.S. Cl.
  CPC .. *H01L 2224/119* (2013.01); *H01L 2224/1145* (2013.01); *H01L 2224/1146* (2013.01); *H01L 2224/1161* (2013.01); *H01L 2224/1182* (2013.01); *H01L 2224/11416* (2013.01); *H01L 2224/11462* (2013.01); *H01L 2224/11616* (2013.01); *H01L 2224/11849* (2013.01); *H01L 2224/11901* (2013.01); *H01L 2224/131* (2013.01); *H01L 2224/13012* (2013.01); *H01L 2224/13013* (2013.01); *H01L 2224/13014* (2013.01); *H01L 2224/1319* (2013.01); *H01L 2224/13022* (2013.01); *H01L 2224/13024* (2013.01); *H01L 2224/13025* (2013.01); *H01L 2224/13076* (2013.01); *H01L 2224/13082* (2013.01); *H01L 2224/13111* (2013.01); *H01L 2224/13147* (2013.01); *H01L 2224/13186* (2013.01); *H01L 2224/13566* (2013.01); *H01L 2224/13624* (2013.01); *H01L 2224/1411* (2013.01); *H01L 2224/14133* (2013.01); *H01L 2224/16145* (2013.01); *H01L 2224/16146* (2013.01); *H01L 2224/16235* (2013.01); *H01L 2224/16237* (2013.01); *H01L 2224/16238* (2013.01); *H01L 2224/17107* (2013.01); *H01L 2224/17133* (2013.01); *H01L 2224/17177* (2013.01); *H01L 2224/17181* (2013.01); *H01L 2224/81141* (2013.01); *H01L 2224/81193* (2013.01); *H01L 2224/81194* (2013.01); *H01L 2224/81801* (2013.01); *H01L 2224/92* (2013.01); *H01L 2224/9211* (2013.01); *H01L 2224/94* (2013.01); *H01L 2225/06513* (2013.01); *H01L 2225/06541* (2013.01); *H01L 2225/06593* (2013.01); *H01L 2924/00014* (2013.01); *H01L 2924/07811* (2013.01)

(56) References Cited

U.S. PATENT DOCUMENTS

| | | | |
|---|---|---|---|
| 7,793,414 B2 | 9/2010 | Haba et al. | |
| 8,053,900 B2 | 11/2011 | Yu et al. | |
| 2001/0053567 A1* | 12/2001 | Akram et al. | 438/127 |
| 2007/0045869 A1* | 3/2007 | Ho et al. | 257/780 |
| 2009/0098724 A1* | 4/2009 | Yu | 438/614 |
| 2011/0079895 A1* | 4/2011 | Lu et al. | 257/737 |
| 2011/0298123 A1* | 12/2011 | Hwang et al. | 257/737 |

FOREIGN PATENT DOCUMENTS

| | | |
|---|---|---|
| JP | 11-054565 A | 2/1999 |
| JP | 2002-270718 A | 9/2002 |
| JP | 2010-103533 A | 5/2010 |
| JP | 2011-091087 A | 5/2011 |

\* cited by examiner

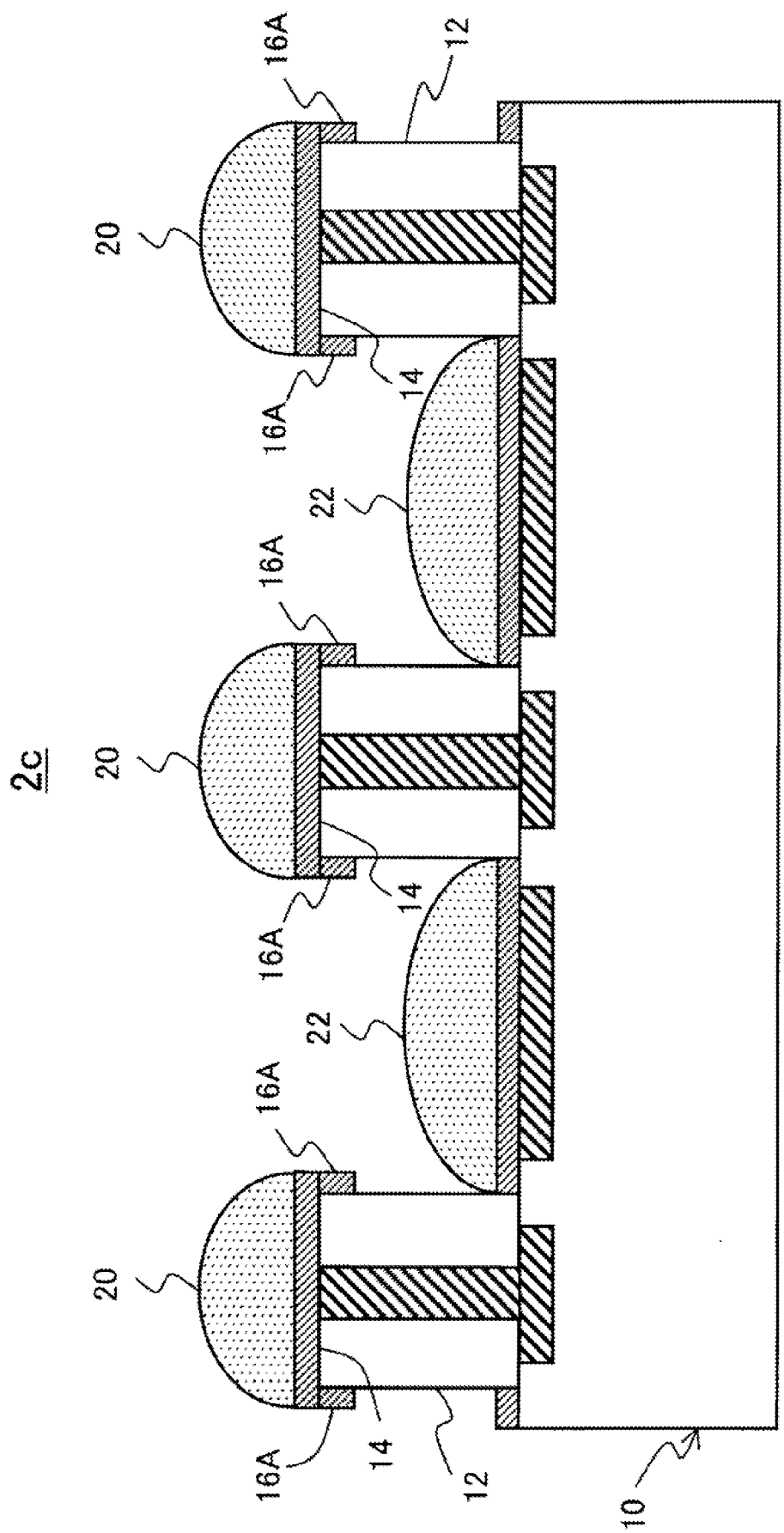

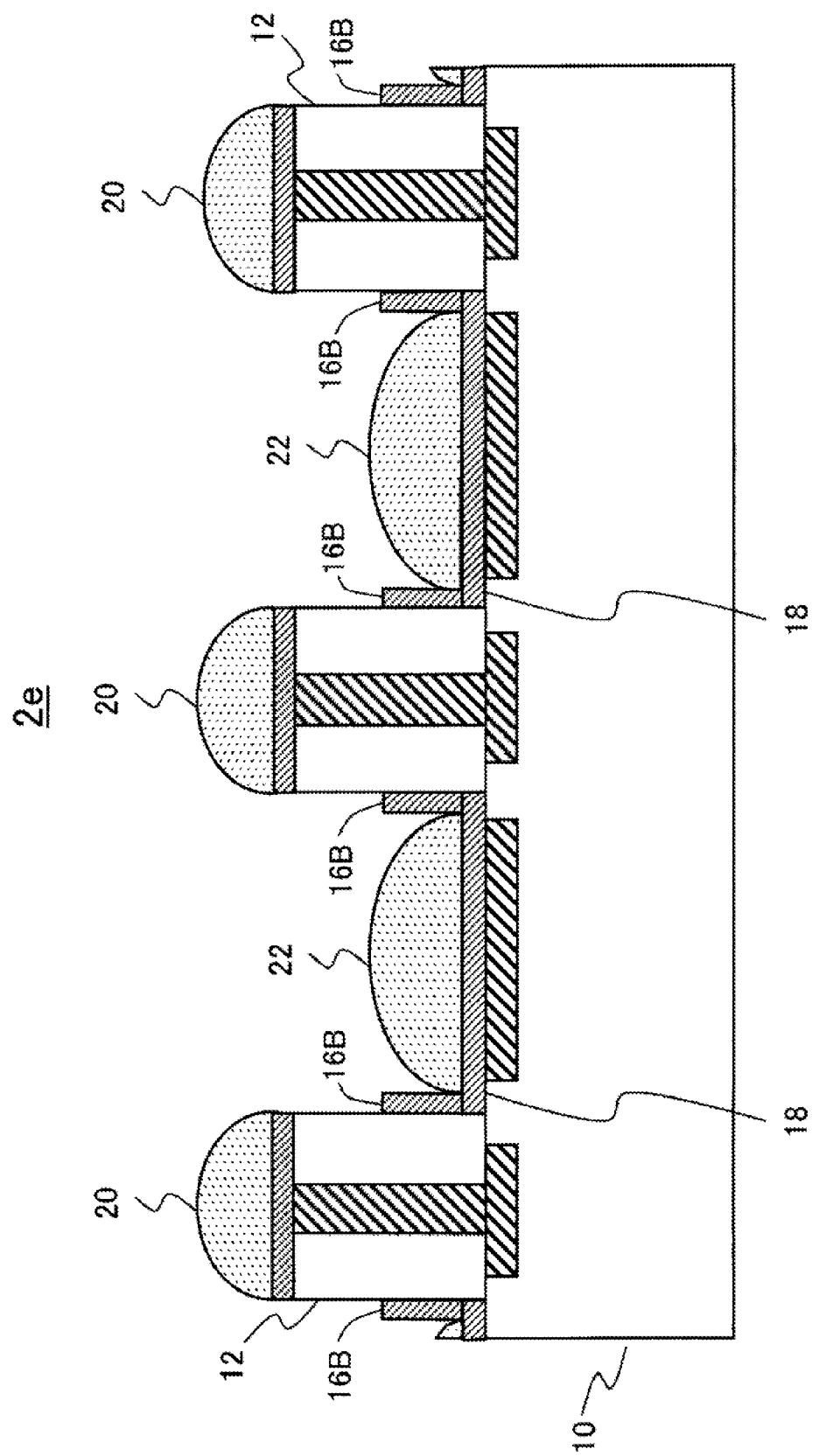

SEMICONDUCTOR DEVICE AND MANUFACTURING METHOD THEREFOR

CROSS-REFERENCE TO RELATED APPLICATIONS

This application is based upon and claims the benefit of priority of the prior Japanese Patent Application No. 2011-165227, filed on Jul. 28, 2011, the entire contents of which are incorporated herein by reference.

FIELD

The embodiments discussed herein are related to a semiconductor device, a multichip semiconductor device, a device and a manufacturing method therefor.

BACKGROUND

With the advance of semiconductor packaging technology, it has been possible to mount a plurality of integrated circuit chips in a package. By this, a rapid progress has been made in high functionality and high integration of a semiconductor device.

In such a semiconductor device, a protruding electrode (bump), formed of a low melting point metal, bonds semiconductor integrated circuits, or a semiconductor integrated circuit and a package substrate. (For example, refer to Japanese Laid-Open Patent Publication NO. 11-54565)

SUMMARY

According to an aspect of the embodiments, A semiconductor device includes a plurality of protrusions formed on a first face of the semiconductor device; first bonding portions formed on upper portions of the plurality of protrusions; second bonding portions formed on side faces of the plurality of protrusions; and third bonding portions formed on the first face between the plurality of protrusions, wherein the semiconductor device is configured to bond to an other semiconductor device through the third from the first bonding portions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 19 is a cross section of a deformed example of the semiconductor device;

FIG. 21 is a cross section of another deformed example of the semiconductor device;

DESCRIPTION OF EMBODIMENTS

As described previously, a rapid progress has been made in high functionality and high integration of a semiconductor device.

In such a semiconductor device, a protruding electrode (bump), formed of a low melting point metal, bonds semiconductor integrated circuits, or a semiconductor integrated circuit and a package substrate.

The high functionality and high integration of the semiconductor device are accelerated by the miniaturization of the bump. For example, in an SiP (system in package) systematized by mounting a plurality of integrated circuits in a package, a bump with a diameter of 200 μm or smaller, which is called a micro bump, is applied.

However, as the bump is miniaturized, an area where a connection terminal (for example, electrode pad) contacts to the bump becomes small. Here, a bump is mounted on the connection terminal. As a result, a problem occurs such that bonding strength between the connection terminal and the bump is deteriorated, and bonding strength between integrated circuit chips (or between an integrated circuit chip and a substrate) is weakened.

Preferred embodiments will be explained with reference to accompanying drawings.

By the present device, a large bonding strength between a semiconductor device and another semiconductor device (or a substrate) is obtained.

Embodiment 1

(1) Structure

Figure 1:
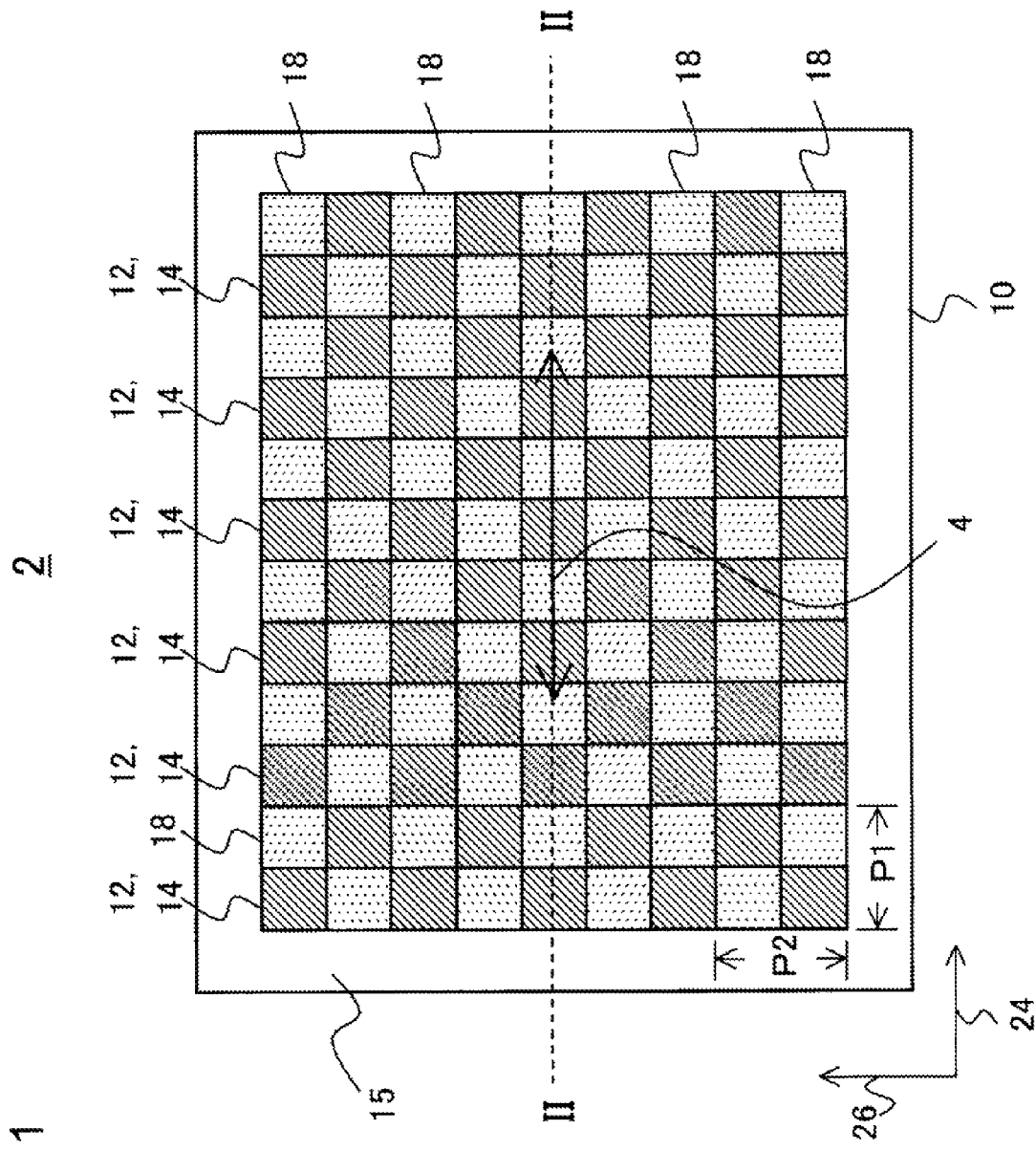
FIG. 1 is a plan view of a semiconductor device according to the embodiment 1.
Figure 2:
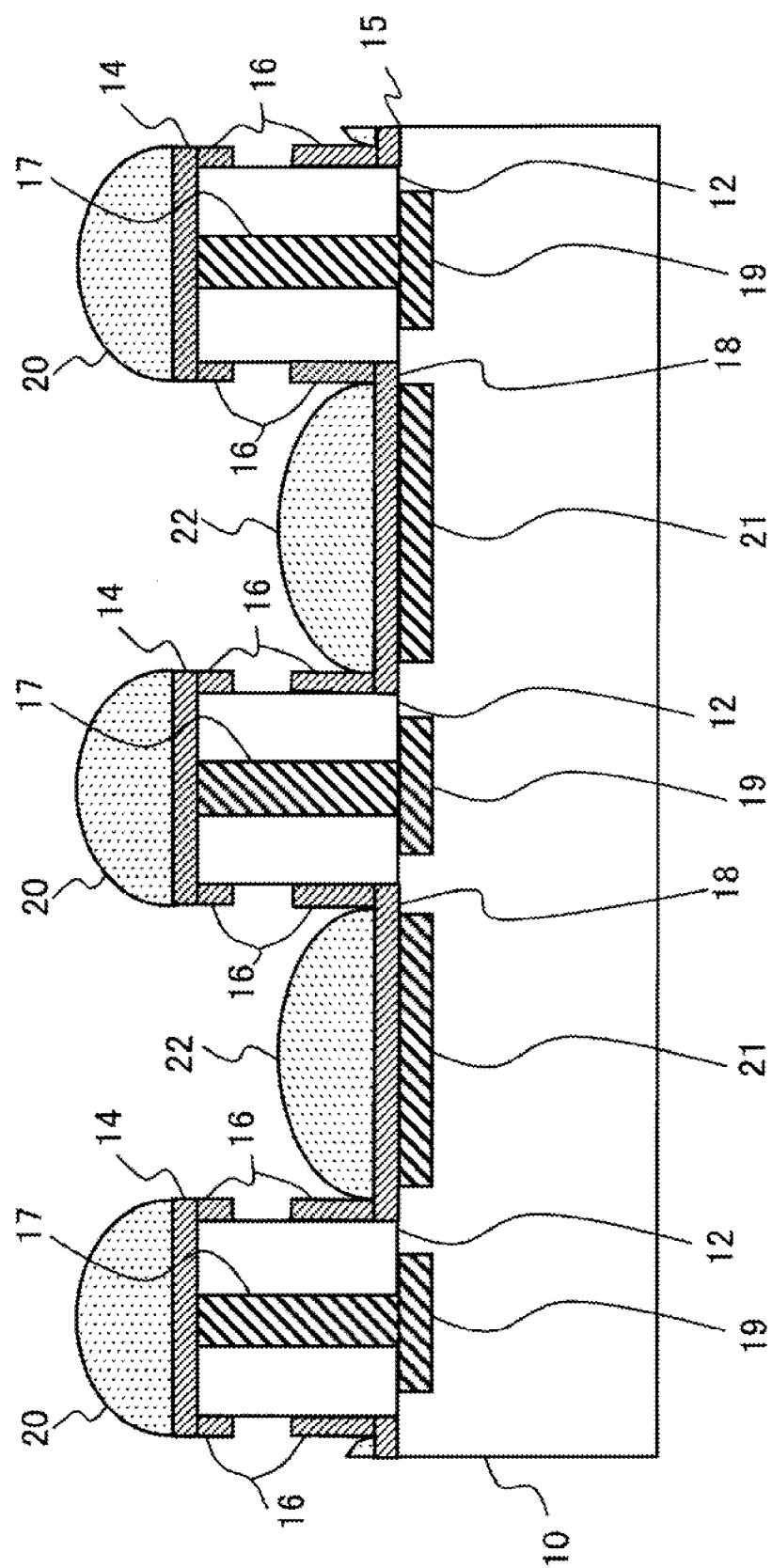
FIG. 2 is a cross section along a line II-II depicted in FIG. 1.

FIG. 1 is a plan view of a semiconductor device 2 according to the present embodiment. FIG. 2 is a cross section along a line II-II depicted in FIG. 1. In FIG. 2, the cross section in the range depicted with an arrow 4 of the line II-II is depicted.

As illustrated in FIG. 2, the semiconductor device 2 includes a semiconductor substrate (for example, Si substrate) 10, a plurality of protrusions 12, first bonding portions 14 and second bonding portions 16 and a plurality of third bonding portions 18. Further, the semiconductor device 2 includes conductive first bumps (protruding electrodes) 20 disposed on the first bonding portions 14, and conductive second bumps 22 disposed on the third bonding portions 18. The first and the second bumps 20, 22 are, for example, SnAg lead-free solder bumps.

As illustrated in FIG. 2, each protrusion 12 is formed on the surface of the semiconductor substrate 10 (that is, a first surface 15 of the semiconductor substrate 10). The protrusion 12 is formed of an insulator having a through hole. A conductor 17 is provided in the through hole.

As illustrated in FIG. 2, the conductor 17 provided in the through hole contacts to a terminal 19 provided on the semiconductor substrate 10, at the tip where the through hole penetrates through the protrusion 12. The terminal 19 may be connected to an internal circuit (not illustrated) of the semiconductor device 2.

Each first bonding portion 14 is formed on the upper portion of the protrusion 12 (for example, on the vertex of the protrusion 12). The first bonding portion 14 is connected to the terminal 19 of the semiconductor substrate 10 through the conductor 17.

As illustrated in FIG. 2, each second bonding portion 16 is formed on the side face of the protrusion 12. In the example depicted in FIG. 2, the second bonding portion 16 is separated into the upper portion side of the protrusion 12 (a side near the first bonding portion 14) and the lower portion side (a side near the first surface 15). The upper portion of the second bonding portion 16 contacts to the first bonding portion 14, while the lower portion of the second bonding portion 16 contacts to each third bonding portion 18.

Here, the second bonding portion 16 may be formed on either one of the upper portion side and the lower portion side of the protrusion 12, as will be described later. Also, in FIG. 2, a boundary between the first bonding portion 14 and the second bonding portion 16 is depicted with a solid line, and however, the first bonding portion 14 and the second bonding portion 16 may be formed of an identical conductive film. In that case, no physical boundary exists between the first bonding portion 14 and the second bonding portion 16. The same is applicable to a boundary between the third bonding portion 18 and the second bonding portion 16. Also, the same is applicable to other drawings.

On the first surface 15, each third bonding portion 18 is formed between protrusions 12. As illustrated in FIG. 2, the third bonding portion 18 is connected to each terminal 21 provided on the semiconductor substrate 10. The terminal 21 may be connected to an internal circuit (not illustrated) of the semiconductor device 2.

First to third connecting portions 14, 16 and 18 are formed of conductive films (for example, metal films).

As described earlier, FIG. 1 is a plan view of the semiconductor device 2, illustrating the surface (the first surface 15) of the semiconductor device 2 in a state that the bumps 20, 22 are seen through. On the surface of the semiconductor device 2, protrusions 12 are disposed with a first pitch P1 in a first direction 24. Similarly, on the surface of the semiconductor device 2, protrusions 12 are disposed with a second pitch P2 (preferably equal to the first pitch P1) in a second direction 26 orthogonal to the first direction 24. Further, the third bonding portions 18 are formed between the protrusions 12.

The semiconductor device 2 is bonded to another semiconductor device through the third from the first bonding portions 14, 16 and 18 and the bumps 20, 22.

Figure 3:
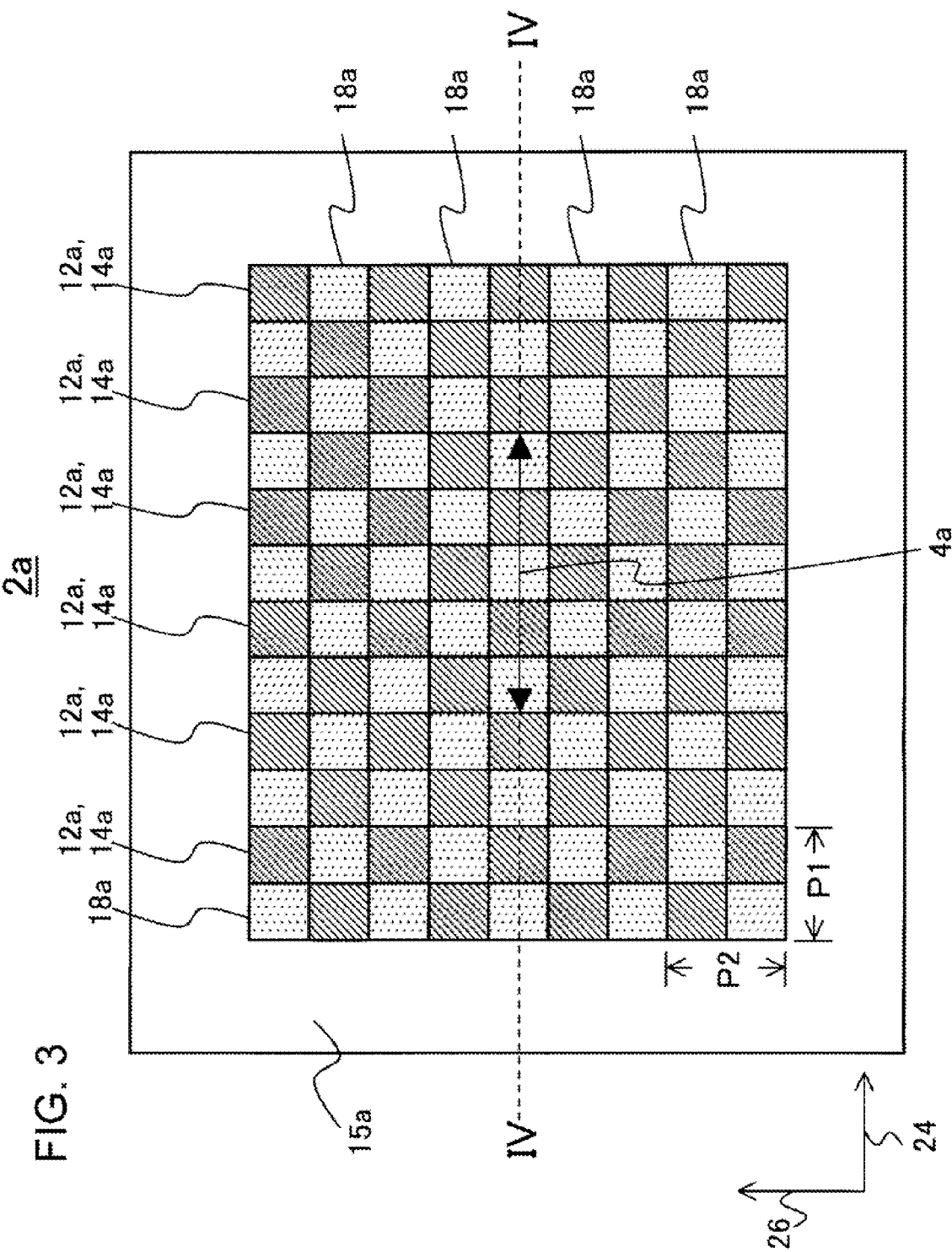
FIG. 3 is a plan view of another semiconductor device to which the semiconductor device is bonded.
Figure 4:
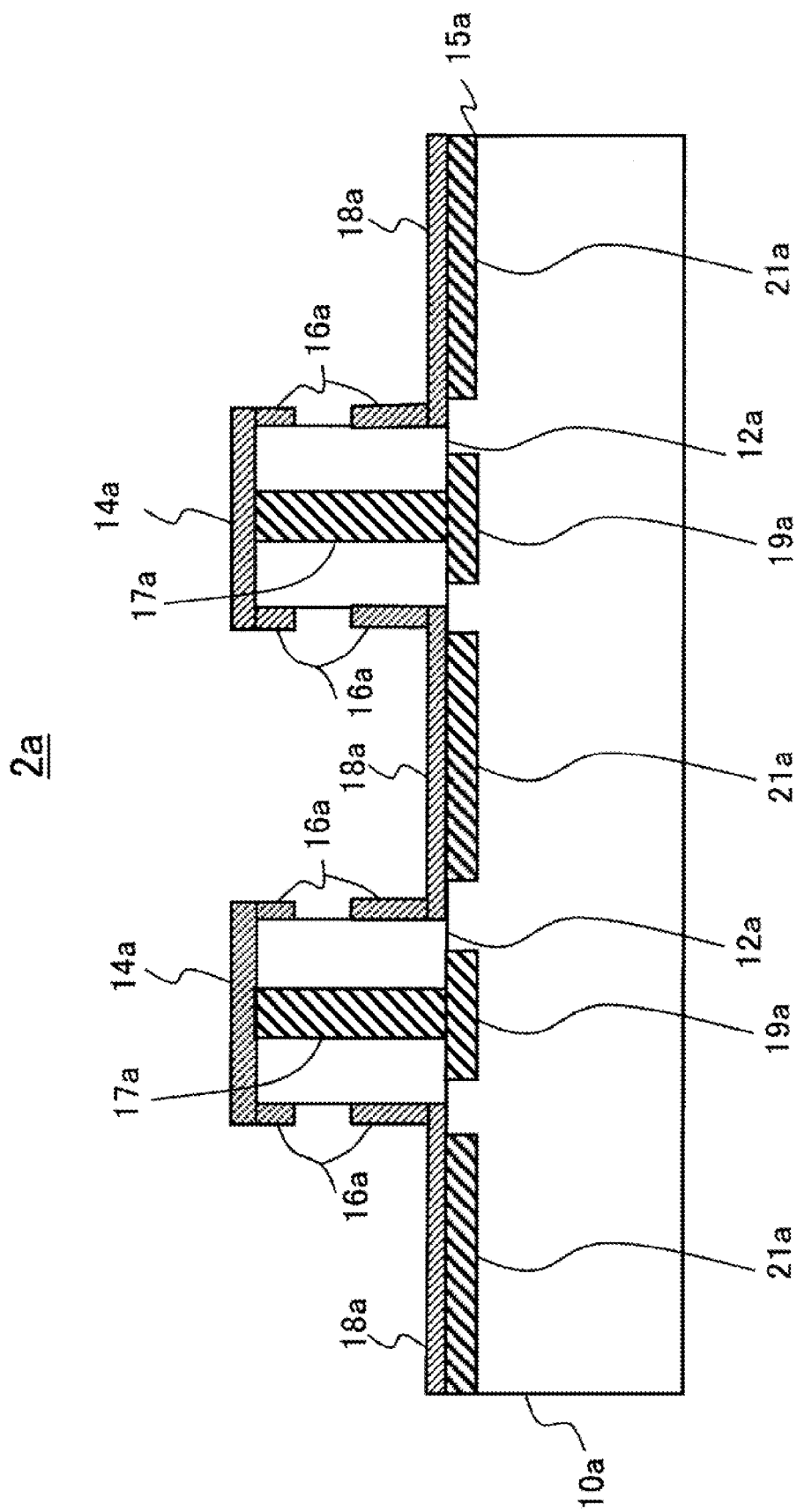
FIG. 4 is a cross section along a line IV-IV depicted in FIG. 3.

FIG. 3 is a plan view of another semiconductor device 2a to which the semiconductor device 2 is bonded. FIG. 4 is a cross section along a line IV-IV depicted in FIG. 3. Here, FIG. 4 is the cross section in a range depicted with an arrow 4a of the line IV-IV.

The other semiconductor device 2a has the substantially same structure as the semiconductor device 2. Namely, as illustrated in FIG. 4, the other semiconductor device 2a includes a semiconductor substrate 10a. Also, the semiconductor device 2a includes a plurality of protrusions 12a, first bonding portions 14a and second bonding portions 16a and a plurality of third bonding portions 18a.

As illustrated in FIG. 4, the protrusions 12a are formed on the surface of the semiconductor substrate 10a. Each protrusion 12a is formed of an insulator having a through hole. In the through hole, a conductor 17a passing through the protrusion 12a is provided. The conductor 17a penetrates through the protrusion 12a and contacts to a terminal 19a provided on the semiconductor substrate 10a.

Each first bonding portion 14a is formed on the upper portion of the protrusion 12a (for example, on the vertex of the protrusion 12a). The first bonding portion 14a is connected to the terminal 19a of the semiconductor substrate through the conductor 17a.

As illustrated in FIG. 4, each second bonding portion 16a is formed on the side face of the protrusion 12a.

Further, on a first surface 15a, each third bonding portion 18a is formed between protrusions 12a. As illustrated in FIG. 4, the third bonding portion 18a is connected to a terminal 21a of the semiconductor substrate 10a.

First to third connecting portions 14a, 16a, 18a are formed of conductive films (for example, metal films).

In short, the structure of the other semiconductor device 2a is substantially identical to the structure of the semiconductor device 2. However, bumps are provided neither on the first bonding portion 14a nor on the third bonding portion 18a.

As illustrated in FIG. 3, on the surface of the other semiconductor device 2a, protrusions 12a are disposed with the first pitch P1 in the first direction 24. Similarly, on the surface of the semiconductor device 2a, protrusions 12a are disposed with the second pitch P2 (preferably equal to the first pitch P1) in the second direction 26 orthogonal to the first direction 24. Further, the third bonding portions 18a are formed between the protrusions 12a.

As illustrated in FIGS. 1 and 3, each position of the protrusions 12a of the other semiconductor device 2a (FIG. 3) corresponds to each position of the third bonding portions 18 of the semiconductor device 2 (FIG. 1). Similarly, each position of the protrusions 12 of the semiconductor device 2 corresponds to each position of the third bonding portions 18a of the other semiconductor device 2a.

The protrusions 12 of the semiconductor device 2 and the protrusions 12a of the other semiconductor device 2a have prescribed section shapes (for example, quadrilaterals) parallel to the surfaces of the semiconductor substrates 10, 10a, with prescribed dimensions.

Therefore, when the semiconductor device 2 is overlaid on the other semiconductor device 2a, the plurality of protrusions 12 of the semiconductor device 2 fit the plurality of protrusions 12a of the other semiconductor device 2a. In the above state, when the bumps 20, 22 are heated while a prescribed load is applied to the semiconductor device 2, the bumps 20, 22 are bonded to the bonding portions of the other semiconductor device 2a, and thus, the semiconductor device 2 and the semiconductor device 2a are bonded together.

Here, the section size of each protrusion 12 of the semiconductor device 2 is made slightly smaller than the size of the third bonding portion 18a of the other semiconductor device 2a. Similarly, the section size of each protrusion 12a of the other semiconductor device 2a is made slightly smaller than the size of a third bonding portion 18 of the semiconductor device 2.

Figure 5:
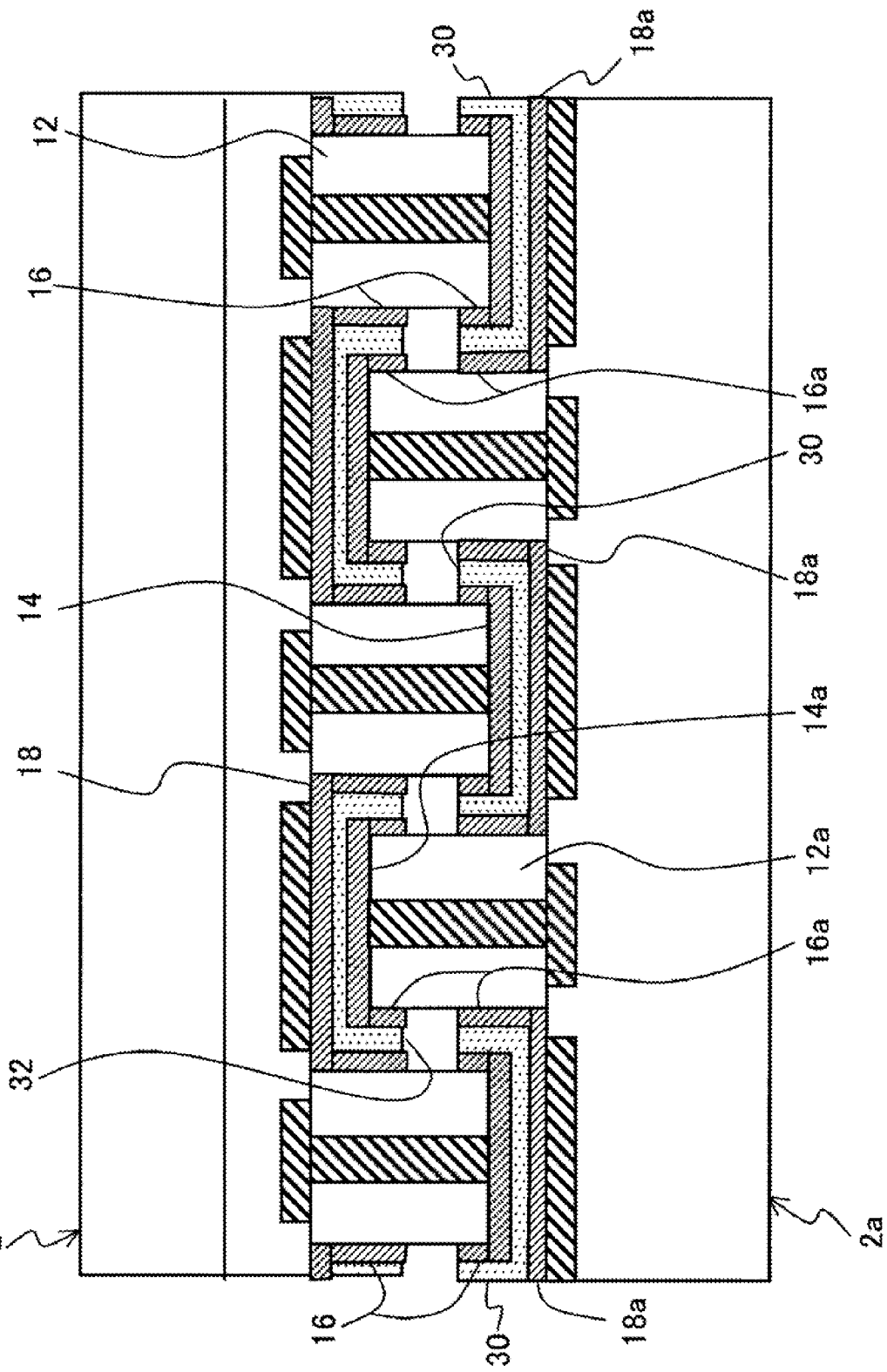
FIG. 5 illustrates a partial cross-section of a multichip semiconductor device including the semiconductor device and the other semiconductor device.

FIG. 5 illustrates a partial cross-section of a multichip semiconductor device 28 including the semiconductor device 2 (hereafter referred to as first semiconductor device) and the other semiconductor device 2a (hereafter referred to as second semiconductor device).

As illustrated in FIG. 5, in the multichip semiconductor device 28, a side face of each protrusion 12 of the first semiconductor device 2 faces a side face of each protrusion 12a of the second semiconductor device 2a. Also, a first bonding portion 14 of the first semiconductor device 2 faces a third bonding portion 18a of the second semiconductor device 2a. Similarly, a first bonding portion 14a of the second semiconductor device 2a faces a third bonding portion 18 of the first semiconductor device 2. As such, in the multichip semiconductor device 28, the protrusion 12 of the first semiconductor device 2 is disposed opposite to the protrusion 12a of the second semiconductor device 2a.

Thus, a second bonding portion 16 of the first semiconductor device 2 is adjacent to a second bonding portion 16a of the second semiconductor device 2a. In this state, the first semiconductor device 2 and the second semiconductor device 2a are bonded together.

The multichip semiconductor device 28 is mounted on a package substrate, for example, and an electrode pad provided on the outer circumference of the second semiconductor device 2a is connected to a lead provided on the periphery of the package substrate by a bonding wire. In the above state, the multichip semiconductor device 28 is sealed with a resin.

In addition, in the semiconductor device 2 depicted in FIG. 2, the bumps 20, 22 are provided on the first bonding portion 14 and the third bonding portion 18. However, a bump may be provided, for example, on the first bonding portion 14 only. In that case, the bump is disposed on the third bonding portion 18a of the second semiconductor device 2a.

Also, in place of the bump, a conductive adhesive (including an anisotropic conductive adhesive) or a metal particle paste may be provided on each bonding portion. Alternatively, the bonding portions may be bonded together by thermal compression bond, without provision of a bonding member such as bump on the bonding portion.

As illustrated in FIG. 5, a portion between the first bonding portion 14 of the first semiconductor device 2 and the third bonding portion 18a of the second semiconductor device 2a is filled with a first bonding material 30. Further, a portion between the upper portion (in FIG. 5, lower side) of the second bonding portion 16 of the first semiconductor device 2 and the lower portion of the second bonding portion 16a of the second semiconductor device 2a is also filled with the first bonding material 30. Here, the first bonding material 30 is a deformed first bump 20 by the application of heat and pressure.

Accordingly, a contact area between the first semiconductor device 2 and the first bonding material 30 equals the sum of the areas of the first bonding portion 14 and the upper portion (lower side in FIG. 5) of the second bonding portion 16. Thus, the contact area between the first semiconductor device 2 and the first bonding material 30 is greater than the area of the first bonding portion 14 by the amount of the area of the upper portion of the second bonding portion 16. As a result, bonding strength between the first semiconductor device 2 and the first bonding material 30 becomes greater.

Similarly, a portion between the first bonding portion 14a of the second semiconductor device 2a and the third bonding portion 18 of the first semiconductor device 2 is filled with a second bonding material 32. Further, a portion between the upper portion of the second bonding portion 16a of the second semiconductor device 2a and the lower portion (upper side in FIG. 5) of the second bonding portion 16 of the first semiconductor device 2 is also filled with the second bonding material 32. Accordingly, bonding strength between the first semiconductor device 2 and the second bonding material 32 becomes greater, similar to the bonding strength between the first semiconductor device 2 and the first bonding material 30.

As such, the bonding strength of the first bonding material 30 and the second bonding material 32 relative to the first semiconductor device 2 is increased. Similarly, the bonding strength of the first bonding material 30 and the second bonding material 32 relative to the second semiconductor device 2a is also increased.

Therefore, in the multichip semiconductor device 28 according to the present embodiment, the bonding strength between the first semiconductor device 2 and the second semiconductor device 2a is increased.

Figure 6:
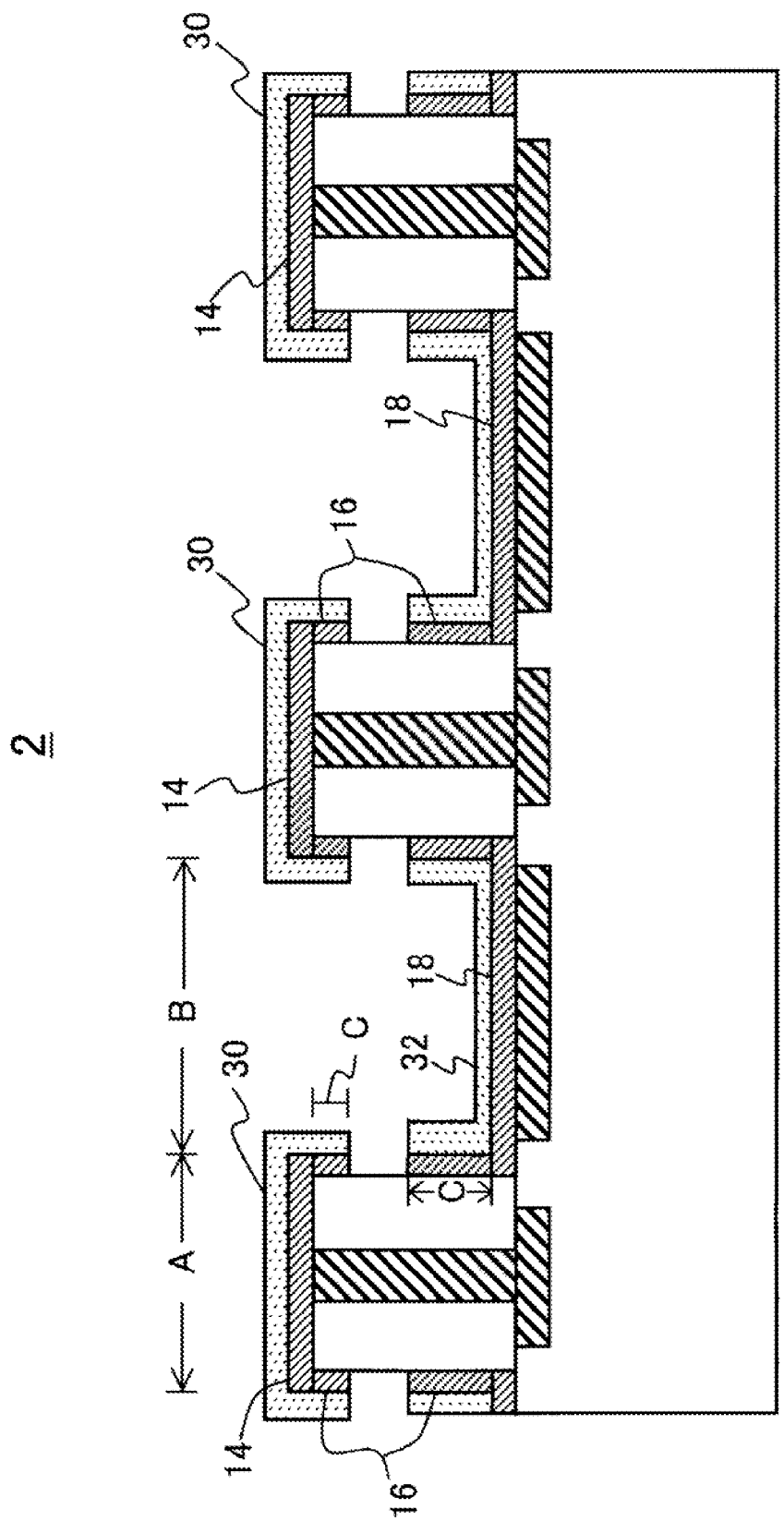
FIG. 6 is a cross section explaining bonding strength between the first semiconductor device and the bonding materials.

FIG. 6 is a cross section explaining bonding strength between the first semiconductor device 2 and the bonding materials 30, 32.

The bonding portions 14, 16 and 18 are formed of conductive films (for example, metal films) easier to be bonded to the bonding materials 30, 32 than to the surface (for example, polyimide film) of the semiconductor substrate 10 excluding the bonding portions 14, 16 and 18. Therefore, the semiconductor device 2 and the bonding materials 30, 32 are bonded together at the bonding portions 14, 16 and 18.

Accordingly, the bonding strength between the semiconductor device 2 and the first bonding material 30 depends on a contact area between the first bonding material 30 and the bonding portions 14, 16 and 18. The same is applicable to the bonding strength between the second bonding material 32 and the semiconductor device 2.

For example, as illustrated in FIG. 6, it is supposed that the first bonding portion 14 is a square having the length of one side A of 140 μm. Also, the exposed portion of the third bonding portion 18 is supposed to be a square having the length of one side B of 180 μm. Each width C of the upper portion and the lower portion of the second bonding portion 16 is supposed to be 20 μm.

In the above case, a contact area between the semiconductor device 2 and the first bonding material 30 per protrusion 12 is around 30,800 μm² (=140 μm×140 μm+20 μm×140 μm×4). Also, a contact area between the semiconductor device 2 and the second bonding material 32 is around 46,800 μm² (=180 μm×180 μm+20 μm×180 μm×4).

Figure 7:
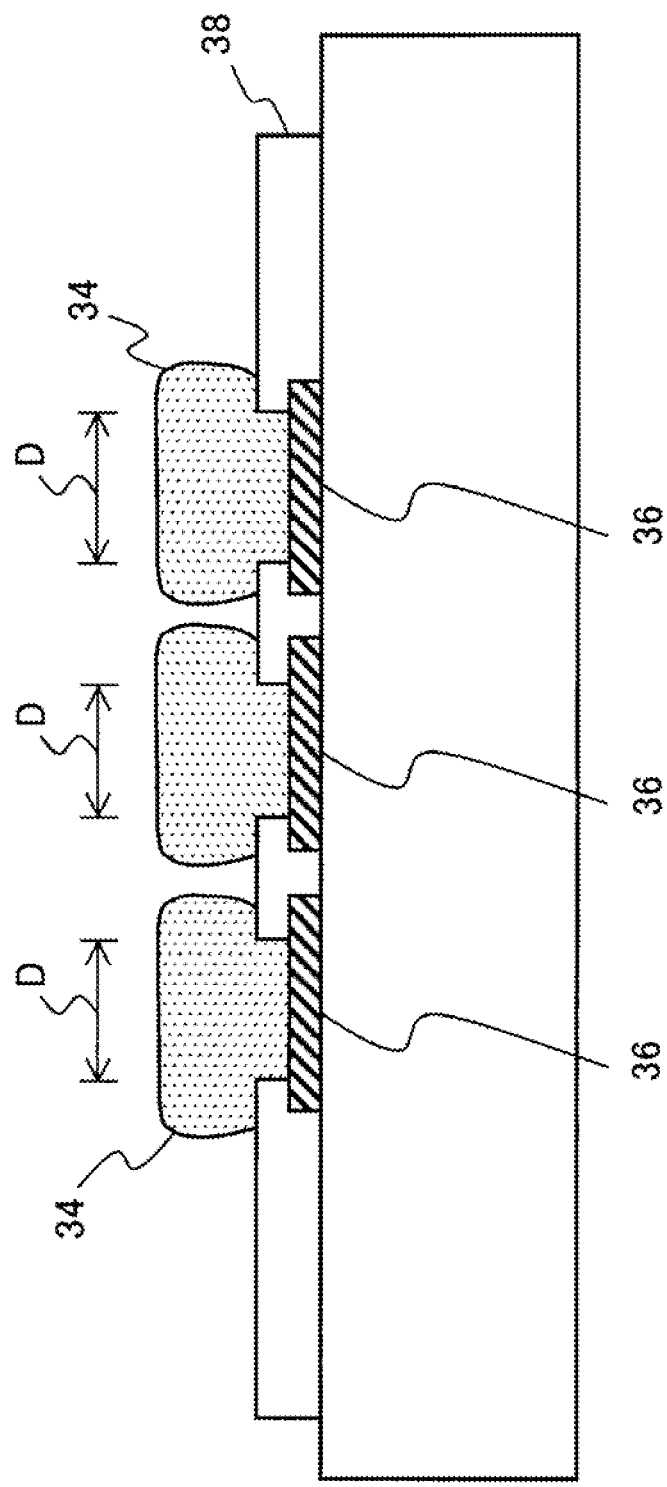
FIG. 7 is a cross section explaining bonding strength between a third semiconductor device including no protrusion and a third bonding material contacting to the surface of the semiconductor device.

FIG. 7 is a cross section explaining bonding strength between a third semiconductor device 2b including no protrusion 12 and a third bonding material 34 contacting to the surface of the semiconductor device 2b. As illustrated in FIG. 7, the third bonding material 34 of the third semiconductor device 2b is assumed to be in contact with an electrode pad 36 disposed on the surface of the semiconductor device 2b. Additionally, it is assumed that the surface of the third semiconductor device 2b, excluding an opening on the electrode pad 36, is covered with an insulating film 38 such as a polyimide film. The third bonding material 34 is a bump for use when the third semiconductor device 2b is bonded to another semiconductor device.

In the first semiconductor device 2 (FIG. 6), the first bonding portions 14 and the third bonding portions 18 are disposed alternately. Then, on assumption that the pitch of the electrode pads 36 of the third semiconductor device 2b (FIG. 7) equals half (=160 μm) the pitch P1 of the first bonding portions 14 of the first semiconductor device 2, the bonding strength of the first semiconductor device 2 and the third semiconductor device 2b relative to the bonding material will be compared below.

In the third semiconductor device 2b (FIG. 7), a diameter D of the opening of the insulating film 38 is made smaller than the pitch (=160 μm) of the electrode pads 36 to prevent mutual contact of the third bonding materials 34.

The diameter of the opening is 100 μm, for example. In this case, a contact area between the electrode pad 36 and the third bonding material 34 becomes 7,850 μm² (=50 μm×50 μm×3.14).

Therefore, the contact area between the bonding portion of the first semiconductor device 2 and the first bonding material 30 (=30,800 μm²) is approximately four-fold the contact area between the electrode pad 36 and the third bonding material 34 (=7,850 μm²). Further, the contact area between the bonding portion of the first semiconductor device 2 and the second bonding material 32 (=46,800 μm²) is approximately six-fold the contact area between the electrode pad 36 and the third bonding material 34 (=7,850 μm²).

Accordingly, the bonding strength of the first semiconductor device 2 to the bonding materials 30, 32 becomes four-fold or greater the bonding strength of the third semiconductor device 2b, including no protrusion 12, to the third bonding material 34.

Figure 8:
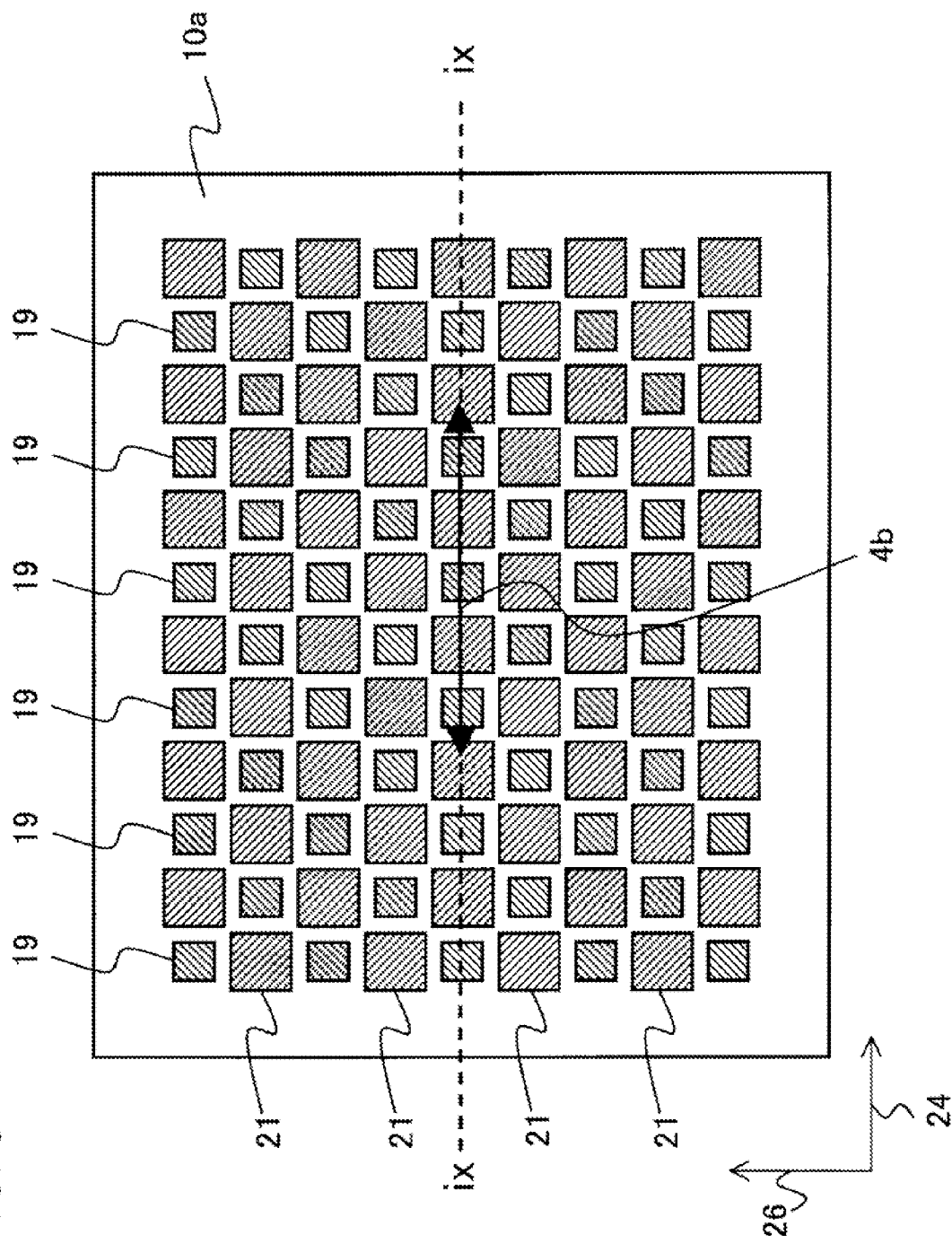
FIG. 8 is a plan view explaining the manufacturing method of the semiconductor device.

Now, the diameter of the micro bump, in which the bonding strength is particularly an issue of concern, is 200 μm or smaller. On the other hand, it is easy to form the first bonding portion 14 if the length of one side thereof is 10 μm or greater. Therefore, preferably, the area of the first bonding portion 14 is 100 μm² (=10 μm×10 μm) or greater, and 40,000 μm² (=200 μm×200 μm) or smaller, and more preferably, it is 400 μm² or greater and 10,000 μm² or smaller, and most preferably, it is 1,000 μm² or greater and 4,000 μm² or smaller (2) Manufacturing Method FIG. 8 is a plan view explaining the manufacturing method of the semiconductor device 2. FIGS. 9A through 14B are process cross sections explaining the manufacturing method of the semiconductor device 2. Here, FIGS. 9A through 14B are process cross sections in the range depicted with an arrow 4b of the line ix-ix depicted in FIG. 8.

Figure 9A:
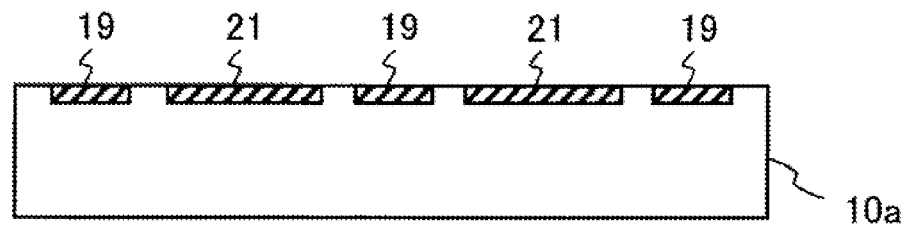
FIG. 9A is a process cross section explaining the manufacturing method of the semiconductor device.

(i) Terminal Formation Process (FIGS. 8, 9A)

First, as illustrated in FIGS. 8 and 9A, a plurality of terminals 19 and 21 (external terminals) are formed on the surface (first surface) of a semiconductor substrate 10a. On the surface of the semiconductor substrate 10a, an internal circuit (integrated circuit or the like) of the semiconductor device is provided, for example.

Here, as illustrated in FIG. 9A, the plurality of terminals 19, 21 include first terminals 19 and second terminals 21. The above first terminals 19 and the second terminals 21 are alternately disposed in a first direction 24 and a second direction 26.

By the present process, the plurality of terminals 19, 21 are formed on the surface (first surface) of the semiconductor substrate 10a.

(ii) Conductor Formation Process (FIGS. 9B-10A)

Figure 9B:
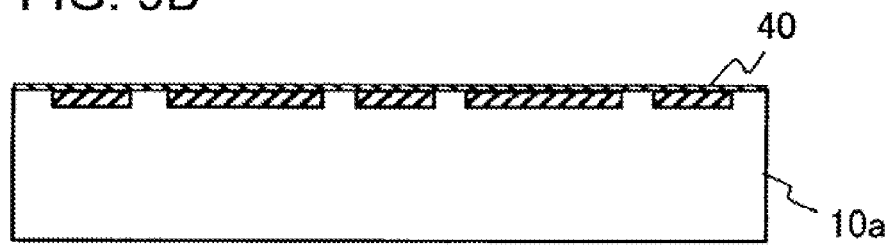
FIG. 9B is a process cross section explaining the manufacturing method of the semiconductor device.
Figure 9C:
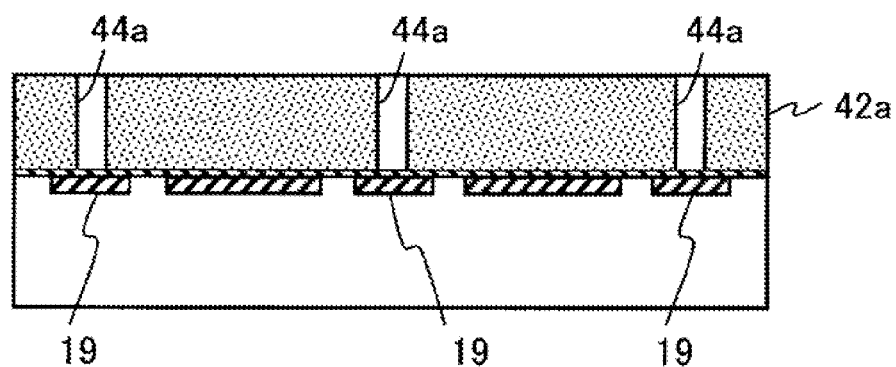
FIG. 9C is a process cross section explaining the manufacturing method of the semiconductor device.

As illustrated in FIG. 9B, a barrier metal (for example, a laminated film of Cr, Ni, etc. or single-layer film) 40 is deposited on the surface of the semiconductor substrate 10a. Thereafter, on the barrier metal 40, a resist film 42a is formed, as illustrated in FIG. 9C. An opening 44a is provided on the resist film 42a so as to expose the barrier metal 40 on the central portion of the first terminal 19.

Figure 9D:
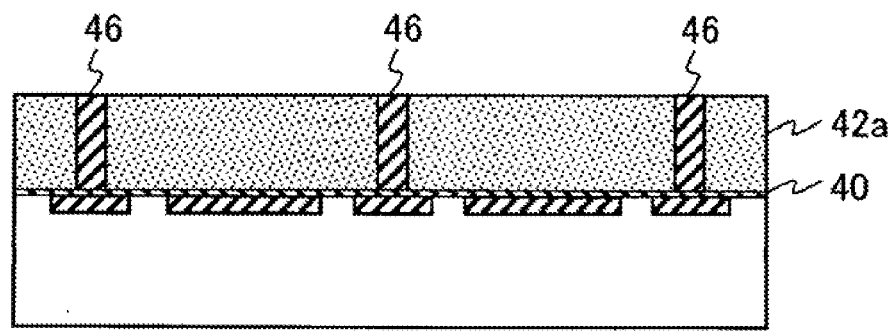
FIG. 9D is a process cross section explaining the manufacturing method of the semiconductor device.

Next, as illustrated in FIG. 9D, a Ni film (not illustrated) is formed inside the opening 44a of the resist film 42a by electrolytic plating, using the barrier metal 40 as a seed layer. On the Ni film, a pillar-shaped conductor (Cu pillar 46) is formed.

Figure 10A:
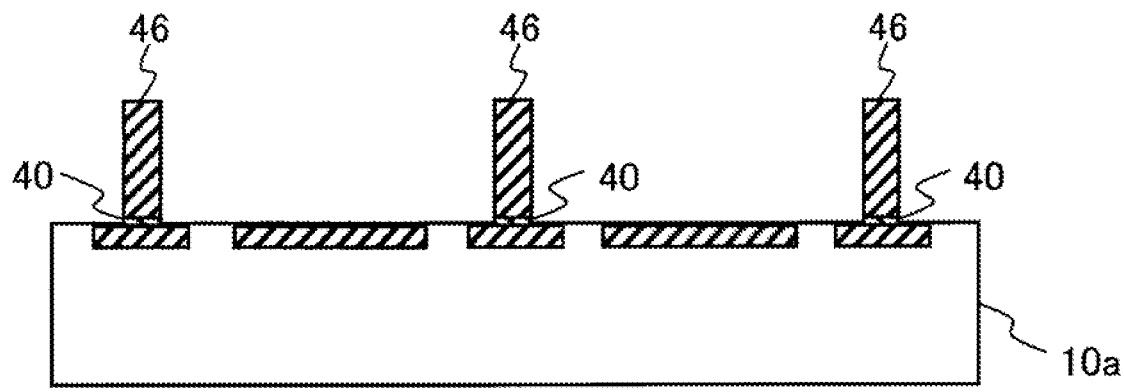
FIG. 10A is a process cross section explaining the manufacturing method of the semiconductor device.

After the Cu pillar is formed, the resist film 42a and the barrier metal 40 (excluding a portion covered with the Cu pillar) are removed, as illustrated in FIG. 10A.

By the present process, among the plurality of terminals 19, 21 provided on the semiconductor substrate 10a, pillar-shaped conductors (Cu pillars 46) are formed on the first terminals 19 alternately disposed in the first direction 24 and the second direction 26.

Figure 10B:
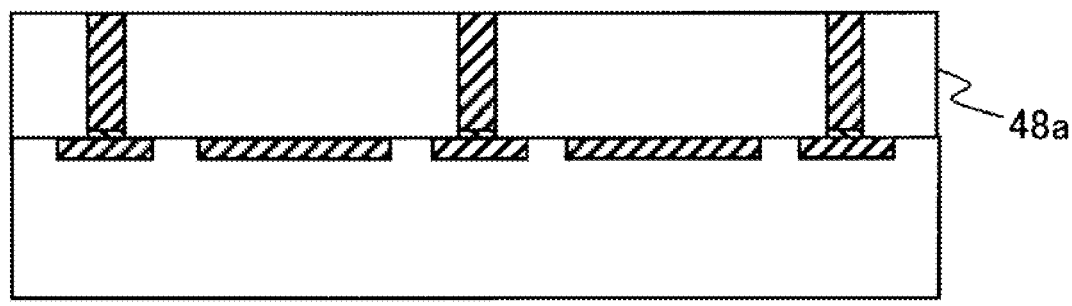
FIG. 10B is a process cross section explaining the manufacturing method of the semiconductor device.
Figure 10C:
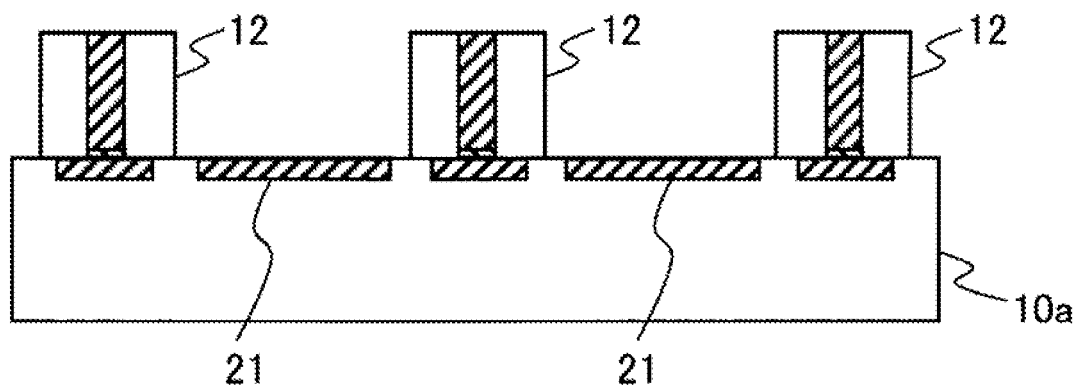
FIG. 10C is a process cross section explaining the manufacturing method of the semiconductor device.

(iii) Protrusion Formation Process (FIGS. 10B, 10C)

On the surface of the semiconductor substrate 10a on which the Cu pillars are formed, an insulating film 48a is formed by an SOD (spin-on-dielectric) method, for example (FIG. 10B).

Thereafter, as illustrated in FIG. 10C, the insulating film 48a is etched while leaving areas that surround the Cu pillars 46 and not overlays surrounding second terminals 21. By this, the protrusions 12 (pillar-shaped insulators) surrounding the Cu pillars 46 (pillar-shaped conductors) are formed on each of the terminals 19.

Figure 11A:
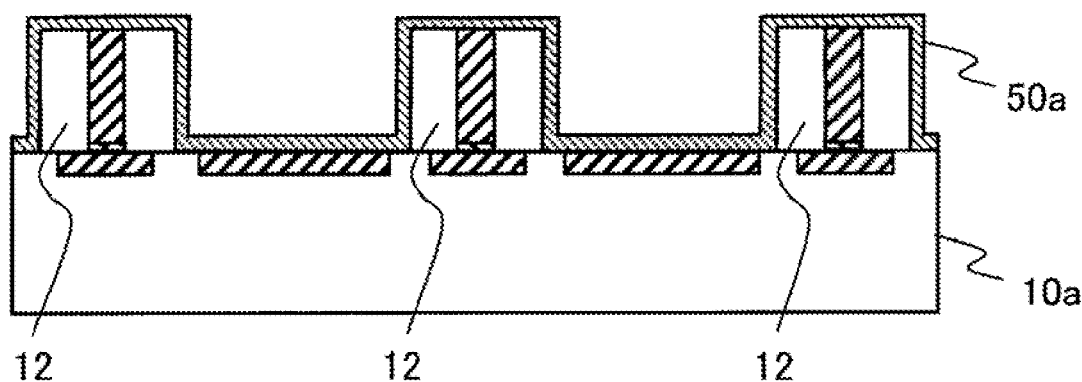
FIG. 11A is a process cross section explaining the manufacturing method of the semiconductor device.
Figure 11B:
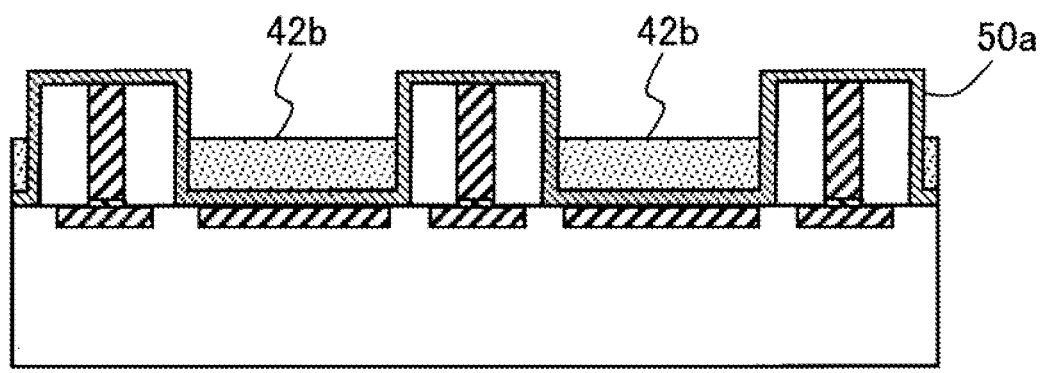
FIG. 11B is a process cross section explaining the manufacturing method of the semiconductor device.
Figure 11C:
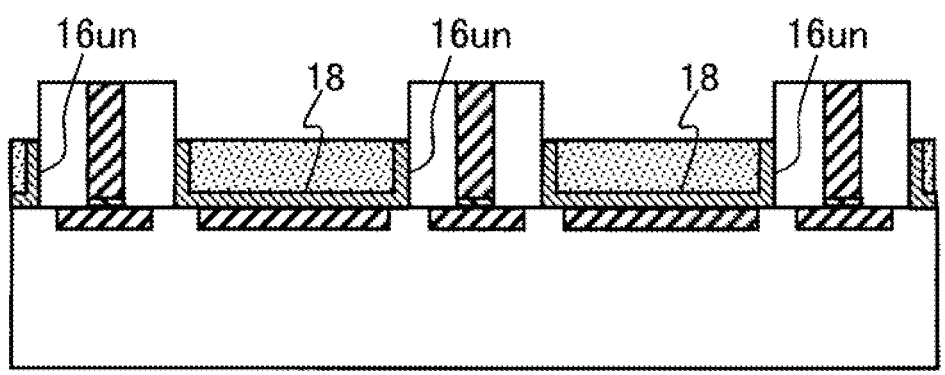
FIG. 11C is a process cross section explaining the manufacturing method of the semiconductor device.

(iv) Formation Process for Lower Portion of Second Bonding Portion and Third Bonding Portion (FIGS. 11A-11C)

First, a conductive film 50a (for example, Al film) is formed to cover the surface of the semiconductor substrate 10a, the vertexes of the protrusions 12 and the side faces of the protrusions 12 (FIG. 11A).

Thereafter, a resist film 42b is formed (FIG. 11B). By use of the resist film 42b as a mask, the conductive film 50a is removed by wet etching (FIG. 11C).

By the present process, a lower portion 16un of the second bonding portion 16 and the third bonding portion 18 are formed.

(v) Formation Process of Upper Second Bonding Portion and First Bonding Portion (FIGS. 12A-14A)

Figure 12A:
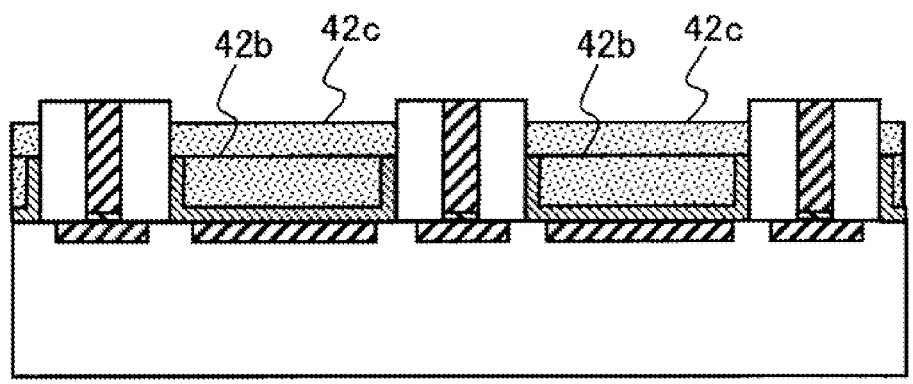
FIG. 12A is a process cross section explaining the manufacturing method of the semiconductor device.

On the resist film 42b, a resist film 42c is formed in such a manner as to expose the vertex of each protrusion 12 and a portion of the side face thereof (FIG. 12A).

Figure 12B:
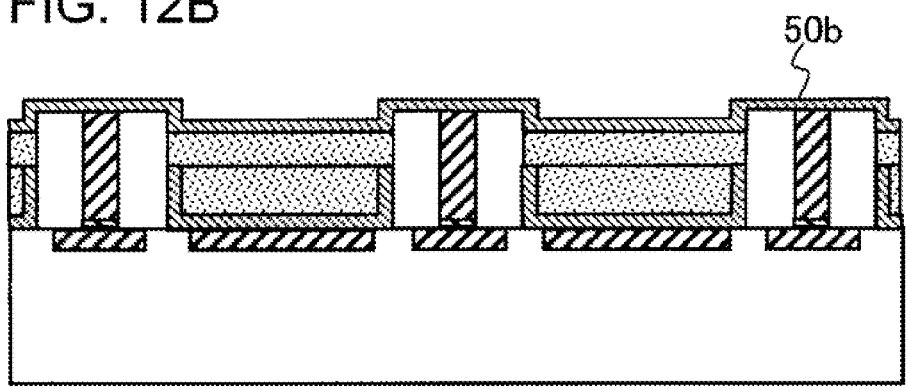
FIG. 12B is a process cross section explaining the manufacturing method of the semiconductor device.
Figure 12C:
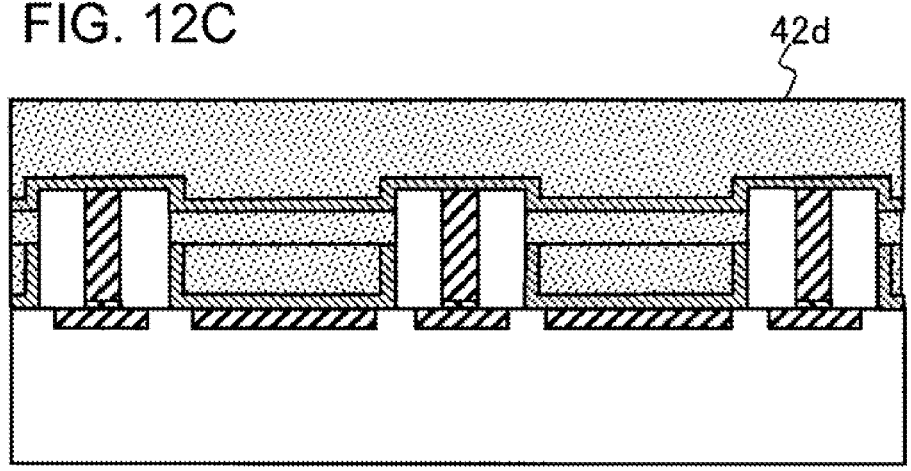
FIG. 12C is a process cross section explaining the manufacturing method of the semiconductor device.

A conductive film 50b (for example, Al film) is deposited on both the exposed surface (vertex and portion of the side face) of the protrusion 12 and the resist film 42c (FIG. 12B). On the conductive film 50b, a resist film 42d is formed (FIG. 12C).

Figure 13A:
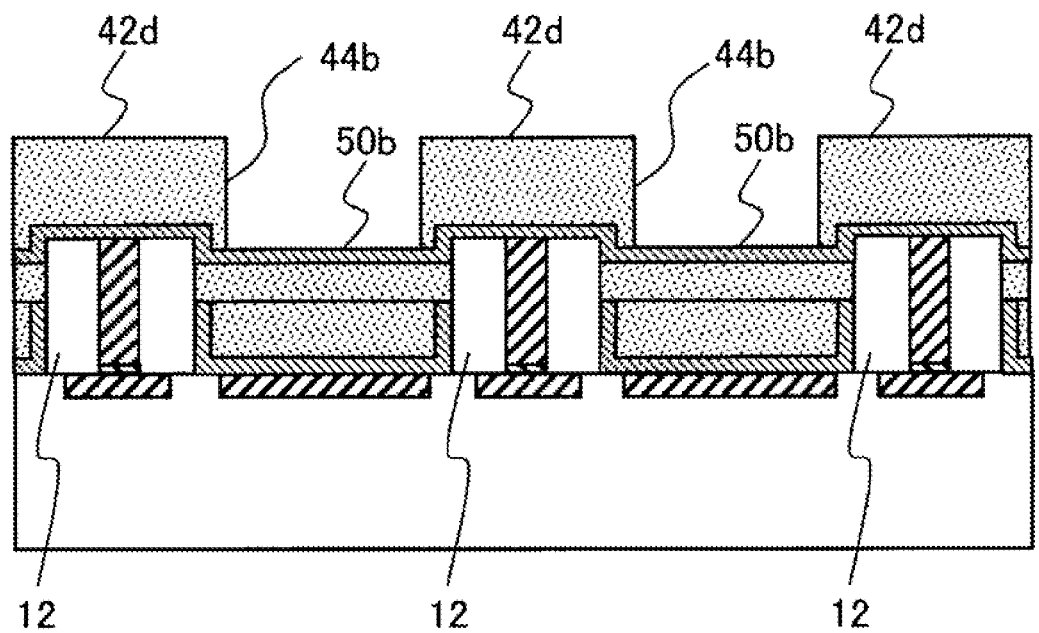
FIG. 13A is a process cross section explaining the manufacturing method of the semiconductor device.

Thereafter, an opening 44b is formed on the resist film 42d. As illustrated in FIG. 13A, the opening 44b is provided between protrusions 12. At this time, the conductive film 50b on the side face of the protrusion is not exposed.

Figure 13B:
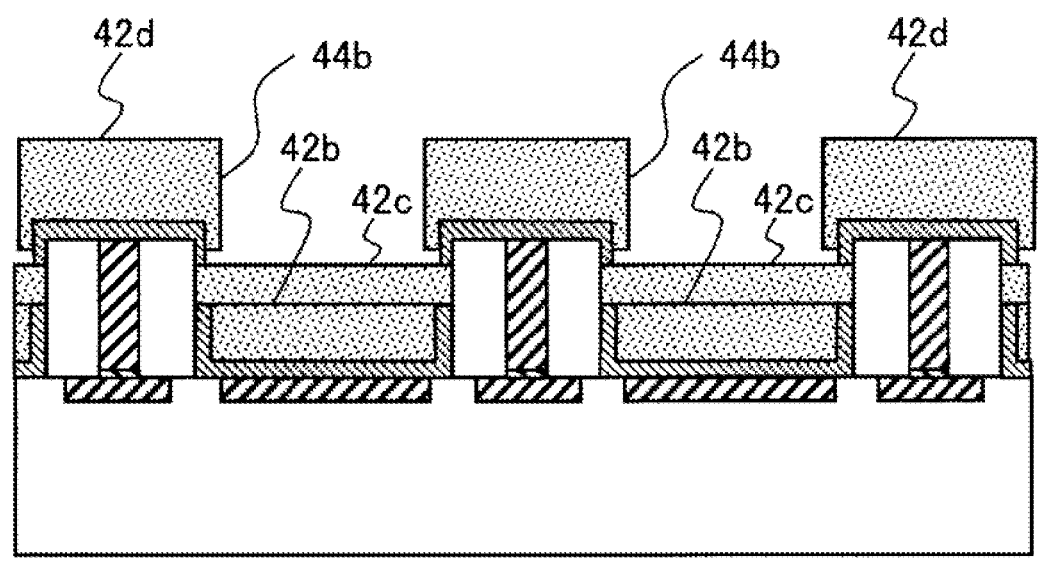
FIG. 13B is a process cross section explaining the manufacturing method of the semiconductor device.
Figure 14A:
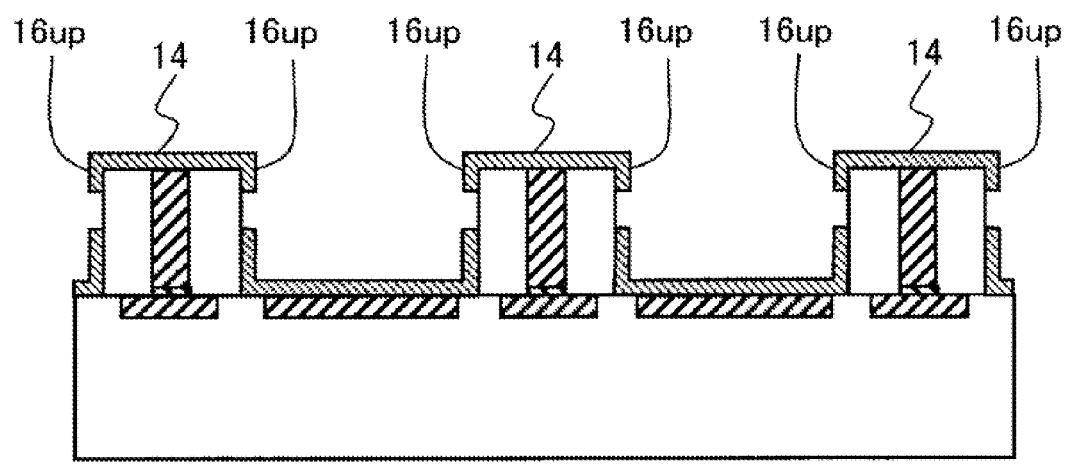
FIG. 14A is a process cross section explaining the manufacturing method of the semiconductor device.

Next, the conductive film 50b exposed on the bottom of the opening 44b is etched (FIG. 13B). Thereafter, the resist films 42b-42d are removed (FIG. 14A).

In the above-mentioned manner, the upper portion 16 up of the second bonding portion 16 and the first bonding portion 14 are formed.

By the above-mentioned "(iv) Formation process for lower portion of second bonding portion and third bonding portion" and the present process, conductive bonding portions 14, 16 and 18 are formed on the upper portions of the protrusions 12 (pillar-shaped insulators) and the side faces thereof, and between the protrusions 12.

Figure 14B:
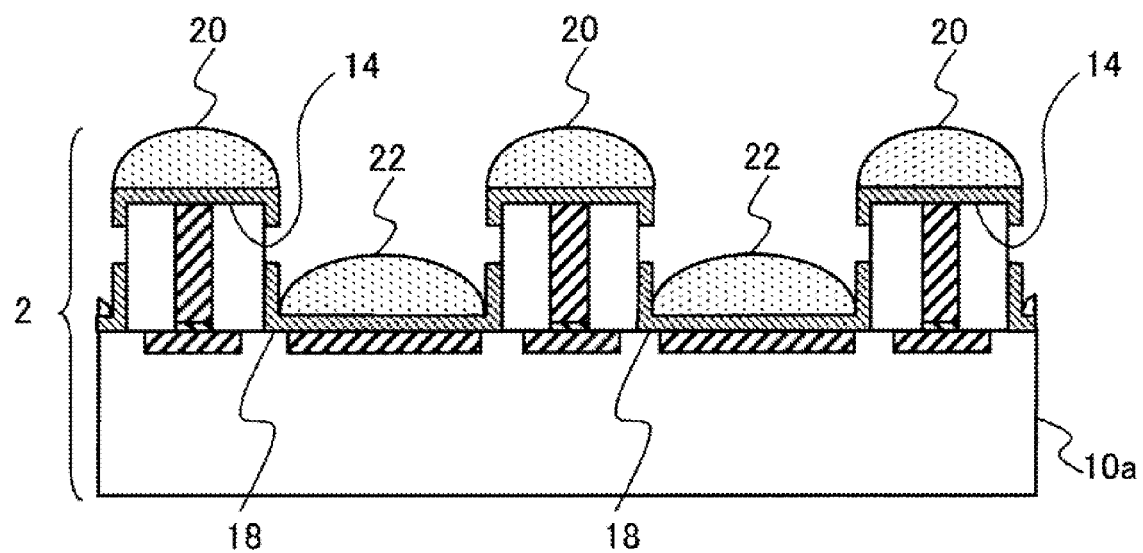
FIG. 14B is a process cross section explaining the manufacturing method of the semiconductor device.

(vi) Bump Formation Process (FIG. 14B)

As illustrated in FIG. 14B, bumps 20, 22 are formed on the first bonding portion 14 and the third bonding portion 18 by plating and reflow processing.

The aforementioned (i)-(vi) processes are carried out on a wafer-by-wafer basis, and after the bumps 20, 22 are formed, a semiconductor device 2 is formed by separating from a wafer.

FIGS. 15A to 16B illustrate process cross sections explaining another manufacturing method for forming protrusions 12 and conductors 56a passing through the protrusions 12.

Figure 15A:
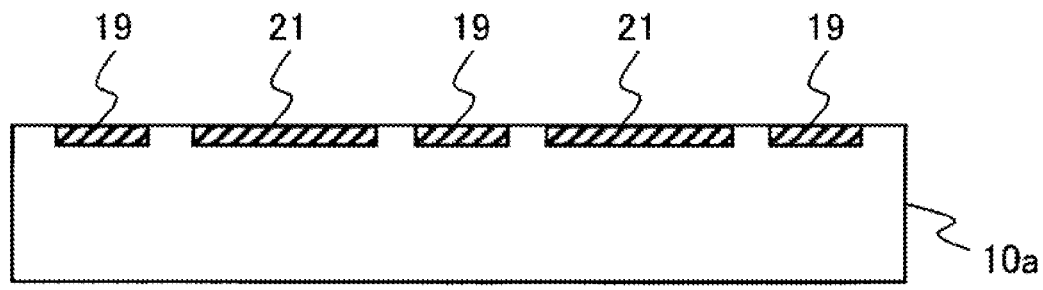
FIG. 15A illustrates a process cross section explaining another manufacturing method for forming protrusions and conductors passing through the protrusions.
Figure 15B:
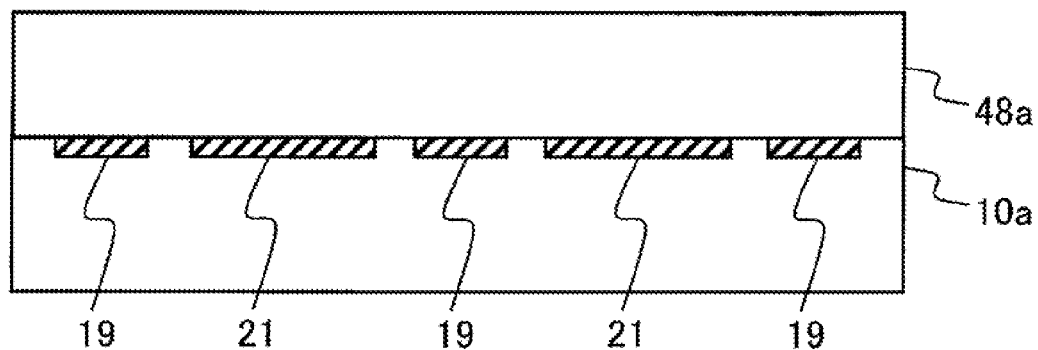
FIG. 15B illustrates a process cross section explaining another manufacturing method for forming protrusions and conductors passing through the protrusions.

First, on the surface of the semiconductor substrate 10a (FIG. 15A) on which the plurality of terminals 19, 21 are formed by the above-mentioned "(i) Terminal formation process", an insulating film 48a is formed by the SOD (spin-on-dielectric) method, for example (FIG. 15B).

Figure 15C:
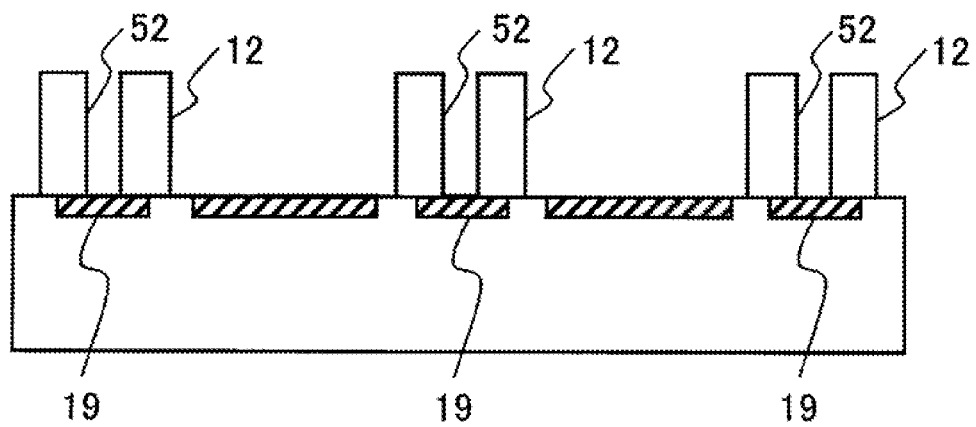
FIG. 15C illustrates a process cross section explaining another manufacturing method for forming protrusions and conductors passing through the protrusions.

By partially etching the insulating film 48a, protrusions 12 (pillar-shaped insulators) having through holes 52 are formed on the first terminals 19 alternately disposed in the first direction 24 and the second direction 26, among the plurality of terminals 19, 21 (FIG. 15C).

Figure 16A:
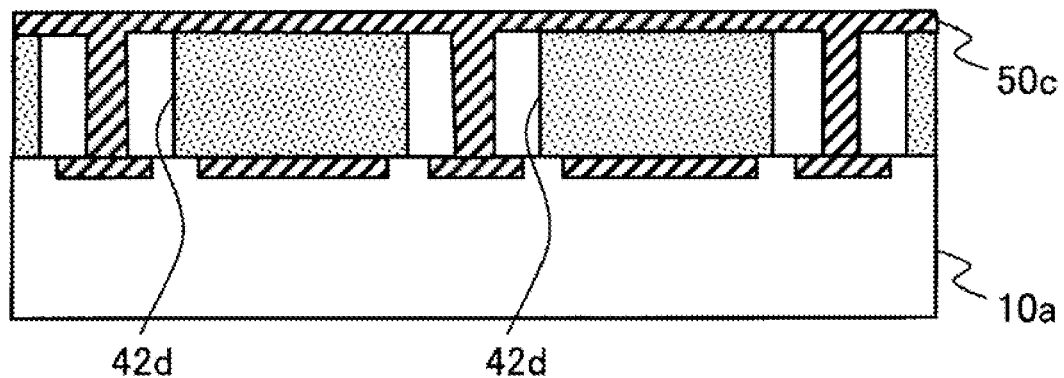
FIG. 16A illustrates a process cross section explaining another manufacturing method for forming protrusions and conductors passing through the protrusions.
Figure 16B:
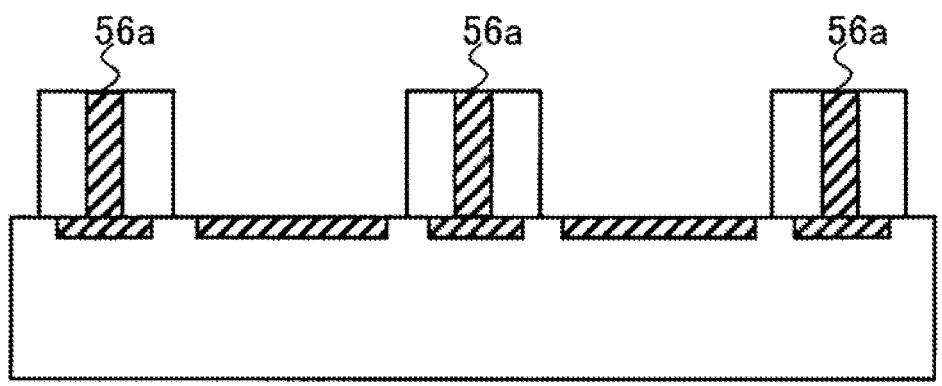
FIG. 16B illustrates a process cross section explaining another manufacturing method for forming protrusions and conductors passing through the protrusions.

Next, a resist film 42d is formed between the protrusions 12. A conductive film 50c is deposited on both the resist film 42d and the protrusions 12, and inside the through holes 52 as well (FIG. 16A). Thereafter, the conductive film 50c formed on the protrusions 12 and the resist film 42d is removed, and further, the resist film 42d is removed (FIG. 16B).

By the above process (FIGS. 15A-16B), the protrusions 12 and the conductors 56a passing through the protrusions 12 are formed. Thereafter, by the execution of "(iv) Formation process for lower portion of second bonding portion and third bonding portion" and the processes subsequent thereto, a semiconductor device 2 is formed.

FIGS. 17A-18B illustrate process cross sections explaining another manufacturing method for forming protrusions 12 and conductors 56b passing through the protrusions 12.

Figure 17A:
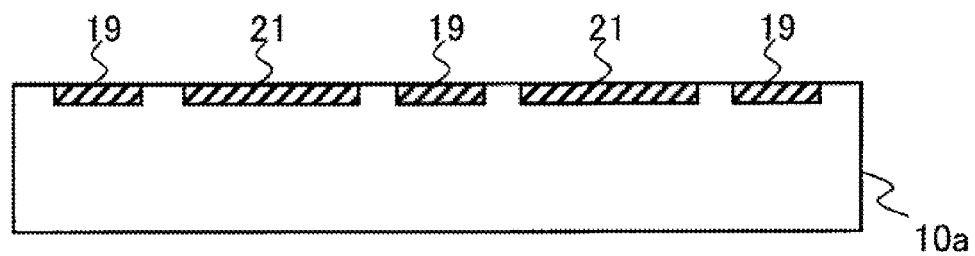
FIG. 17A illustrate a process cross section explaining another manufacturing method for forming protrusions and conductors passing through the protrusions.
Figure 17B:
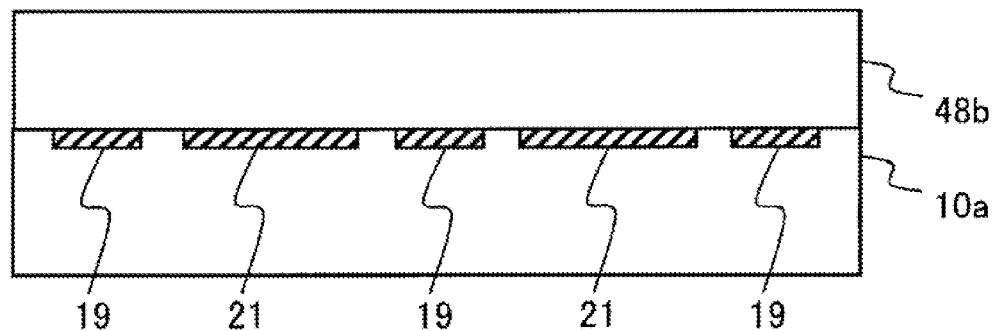
FIG. 17B illustrate a process cross section explaining another manufacturing method for forming protrusions and conductors passing through the protrusions.

First, on the surface of the semiconductor substrate 10a (FIG. 17A) on which the plurality of terminals 19 and 21 are formed by the aforementioned "(i) Terminal formation process", an insulating film 48b is formed by a P-CVD (plasma chemical vapor deposition) method, for example (FIG. 17B).

Figure 17C:
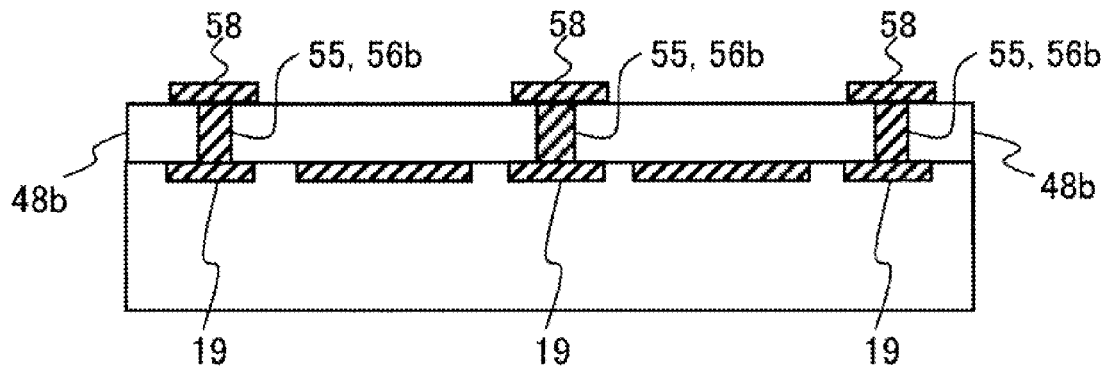
FIG. 17C illustrate a process cross section explaining another manufacturing method for forming protrusions and conductors passing through the protrusions.

Next, a via hole 55 passing through the insulating film 48b is formed on the upper side of each first terminal 19, and a conductor 56b is formed in the above via hole by a damascene method. Further, a conductive pad 58 contacting to the conductor 56b is formed on the insulating film 48b (FIG. 17C).

Thereafter, the above process is repeated for a prescribed number of times. Here, the conductive pad 58 is not formed in the final process.

Figure 18A:
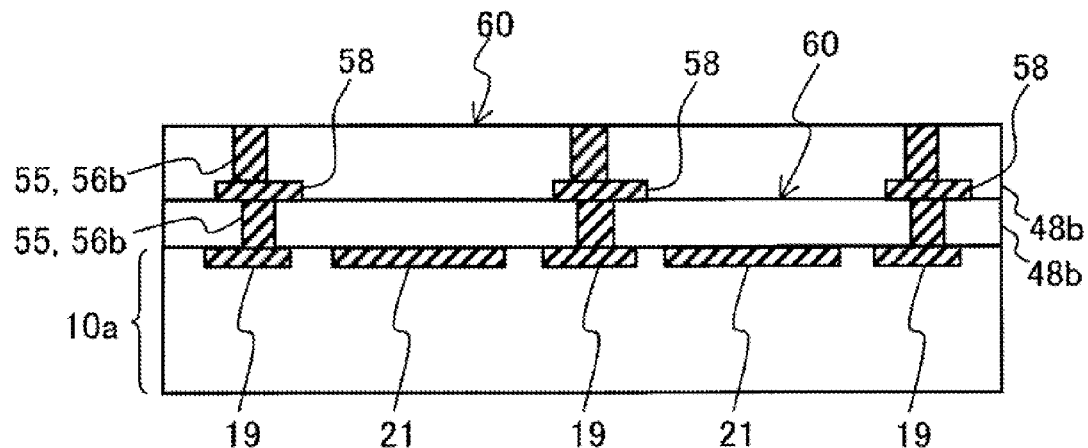
FIG. 18A illustrate a process cross section explaining another manufacturing method for forming protrusions and conductors passing through the protrusions.

Thus, as Illustrated in FIG. 18A, a plurality of conductor-embedded layers 60, each including the insulating film 48b having the via hole 55 (through hole) above the first terminal 19, the conductor 56b filled in the via hole and the conductive pad 58 disposed on the insulating film 48b, are successively laminated on the surface of the semiconductor substrate 10a (FIG. 18A). Here, the conductive pad is not provided in the uppermost conductor-embedded layer, as illustrated in FIG. 18A.

Figure 18B:
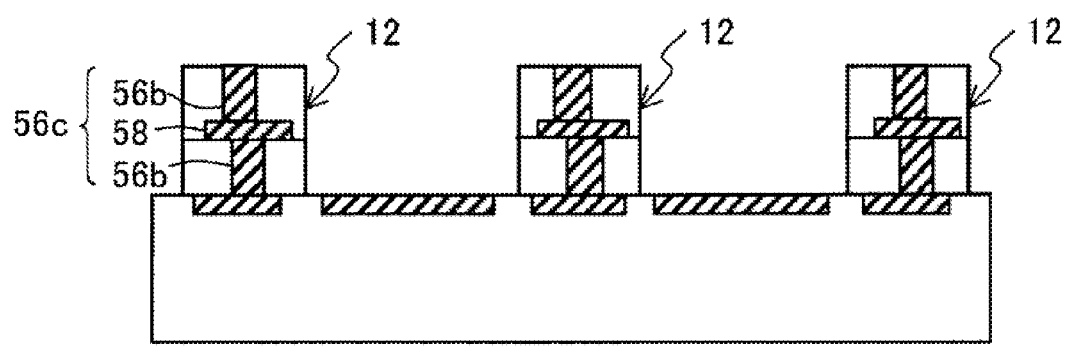
FIG. 18B illustrate a process cross section explaining another manufacturing method for forming protrusions and conductors passing through the protrusions.

Thereafter, each protrusion 12 surrounding the conductor 56b and the conductive pad 58 is formed by etching the plurality of conductor-embedded layers 60 (FIG. 18B). By the above etching, each conductor 56c passing through the protrusion 12 is formed.

By the above-mentioned process, the protrusions 12 and the conductors 56c passing through the protrusions 12 are formed. Thereafter, by the execution of "(iv) Formation process for lower portion of second bonding portion and third bonding portion" and the processes subsequent thereto, a semiconductor device 2 is formed.

(3) Deformed Example

Figure 20:
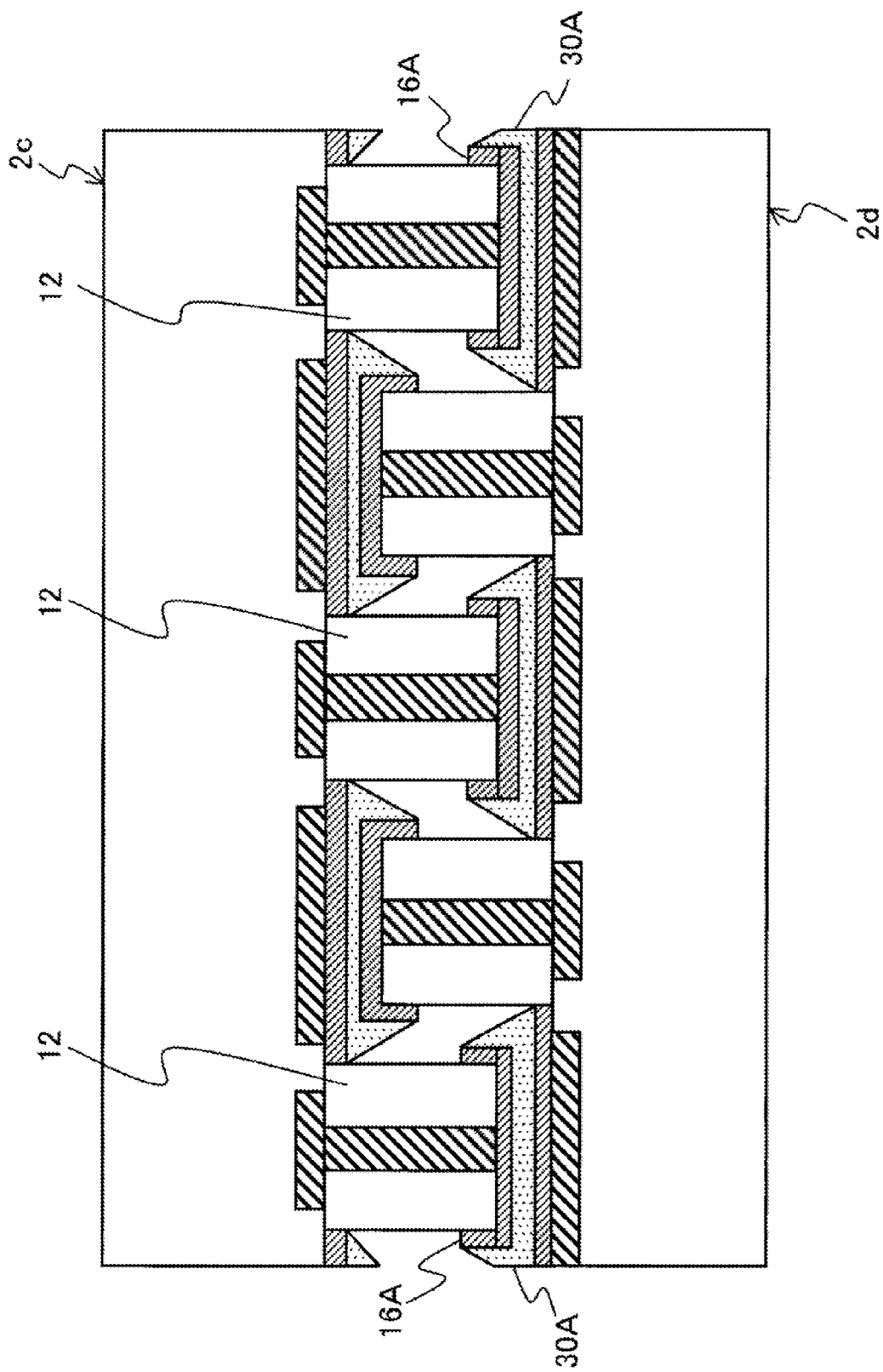
FIG. 20 is a cross section of a state that the deformed example is bonded to another semiconductor device.

FIG. 19 is a cross section of a deformed example 2c of the semiconductor device 2. FIG. 20 is a cross section of a state that the deformed example 2c is bonded to another semiconductor device 2d.

Each second bonding portion 16 of the semiconductor device 2 illustrated in FIG. 2 is separated into the upper portion and the lower portion. In contrast, in the deformed example 2c, a second bonding portion 16A is not separated, and contacts to the first bonding portion 14.

As such, in the deformed example 2c, the second bonding portion 16A is not provided on the lower portion of the side face of the protrusion 12. However, as illustrated in FIG. 20, a first bonding material 30A creeps up and closely adheres to the second bonding portion 16A disposed on the upper portion side (in FIG. 20, lower side) of the side face of the protrusion. Thus, a contact area between the first bonding material 30A and the deformed example 2c increases. Therefore, bonding strength between the deformed example 2c and the first bonding material 30A increases. As a result, bonding strength between the deformed example 2c and another semiconductor device 2d increases.

FIG. 21 is a cross section of another deformed example 2e of the semiconductor device 2. A second bonding portion 16B of the deformed example 2e illustrated in FIG. 21 is not separated also, and contacts to the third bonding portion 18.

More specifically, in the deformed example 2e, a second bonding portion 16B is not provided on the upper portion of the side face of the protrusion 12. However, when bonding to another semiconductor device, a bonding material (bump 22) closely adheres to the second bonding portion 16B provided on the lower portion of the side face of the protrusion 12. Thus, a contact area between the deformed example 2e and the bonding material increases. Therefore, bonding strength between the deformed example 2e and the bonding material increases. As a result, bonding strength between the deformed example 2e and another semiconductor device increases.

The second bonding portion 16B of the deformed example 2e is formed by partially etching the conductive film, formed on the side face of the protrusion 12, on the upper portion of the side face. To etch such an upper portion of the side face, a resist film having an opening on the upper portion of the side face of the protrusion 12 is used. However, it is not easy to form such an opening on the side face of the resist film by the lithographic technology.

FIGS. 22A to 23B are process cross sections illustrating an example of a method for forming the second bonding portions 16B of the deformed example 2e depicted in FIG. 21.

Figure 22A:
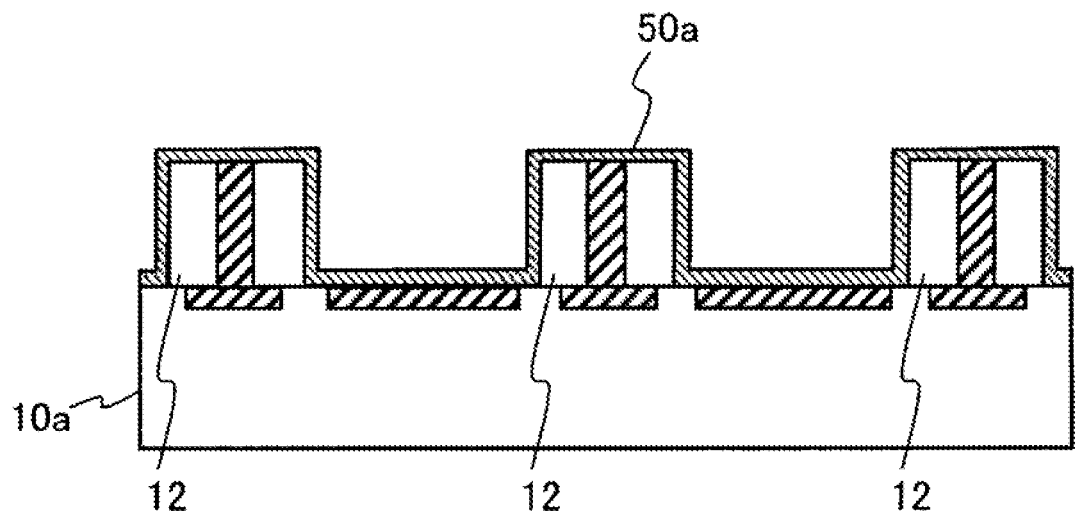
FIG. 22A is a process cross section illustrating an example of a method for forming the second bonding portions of the deformed example depicted in FIG. 21.

First, by the conductive film formation process explained by reference to FIG. 11A, a conductive film 50a (for example, Al film) is formed on the vertex of the protrusion 12, the side face of the protrusion 12 and between the protrusions 12 (FIG. 22A).

Figure 22B:
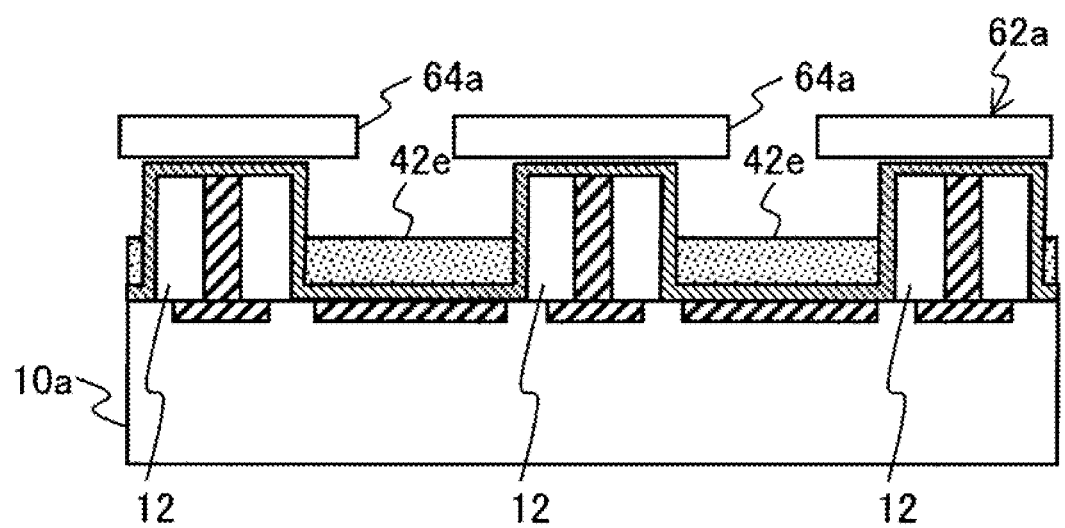
FIG. 22B is a process cross section illustrating an example of a method for forming the second bonding portions of the deformed example depicted in FIG. 21.

Next, by injecting resist liquid from an opening 64a of a metal mask 62a to a portion between the protrusions 12, a resist 42e that covers the lower portion of the protrusion 12 is formed (FIG. 22B). At this time, the surface of the semiconductor substrate 10a is also covered with the resist film 42e.

Figure 23A:
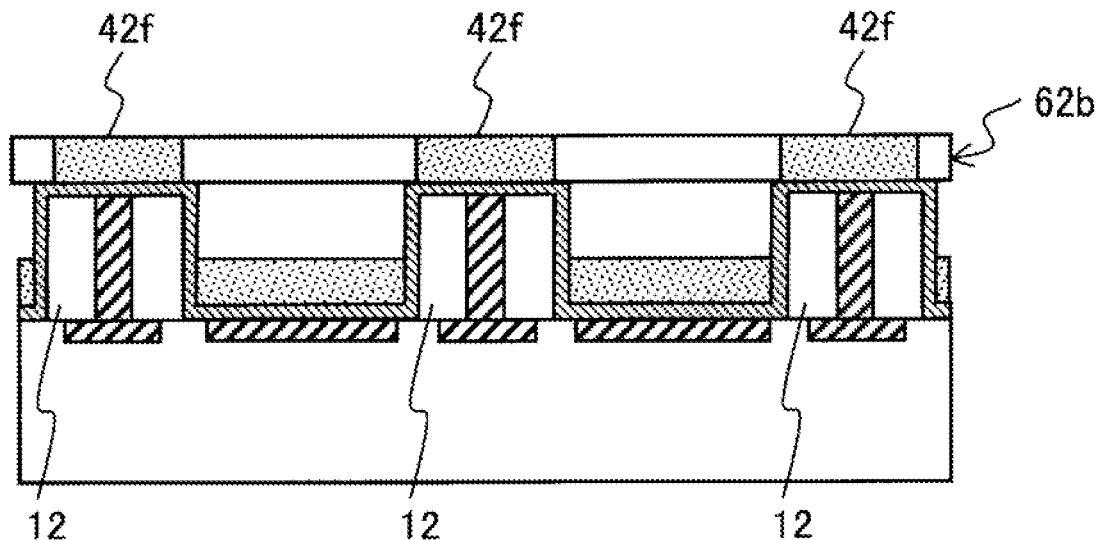
FIG. 23A is a process cross section illustrating an example of a method for forming the second bonding portions of the deformed example depicted in FIG. 21.

Further, as illustrated in FIG. 23A, by injecting resist liquid from an opening of another metal mask 62b to the vertex of the protrusion 12, a resist film 42f that covers the vertex of the protrusion 12 is formed.

Figure 23B:
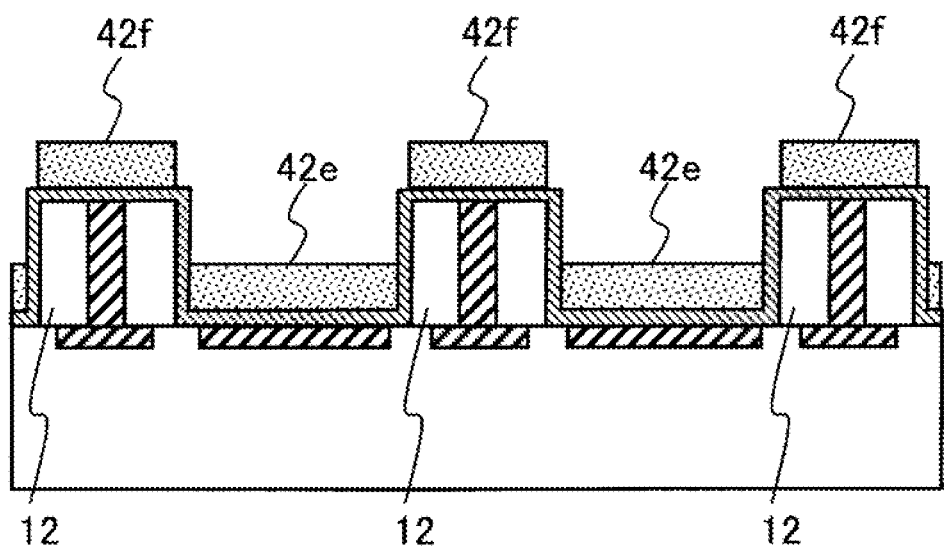
FIG. 23B is a process cross section illustrating an example of a method for forming the second bonding portions of the deformed example depicted in FIG. 21.

By the above process, the resist films 42e, 42f that expose only the upper portion of the side face of the protrusion 12 are formed, as illustrated in FIG. 23B.

Thereafter, the conductive film 50a exposed from the resist film is removed. By this, the second bonding portions 16B depicted in FIG. 21 may be formed.

FIGS. 24A-24E are plan views illustrating variations in the shape of the protrusion 12 when looked from above the surface of the semiconductor device. In FIGS. 24A-24E, the protrusions 12a of the other semiconductor device 2a bonded to the semiconductor device 2 are also depicted.

Figure 24A:
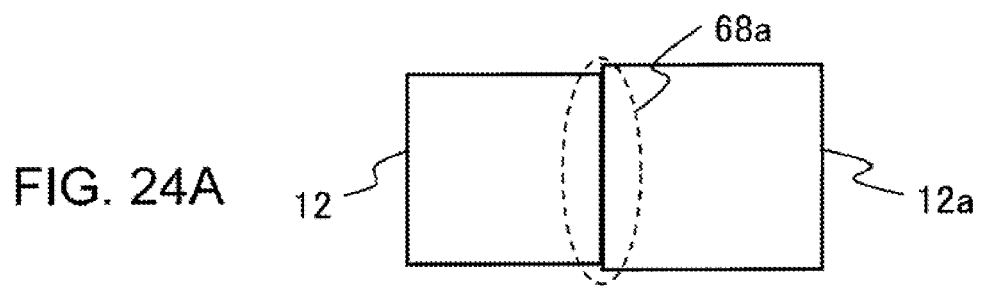
FIG. 24A is a plan view illustrating a variation in the shape of the protrusion when looked from above the surface of the semiconductor device.
Figure 24B:
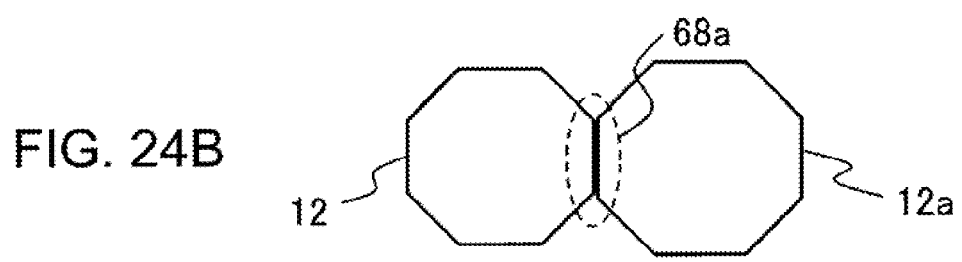
FIG. 24B is a plan view illustrating a variation in the shape of the protrusion when looked from above the surface of the semiconductor device.
Figure 24C:
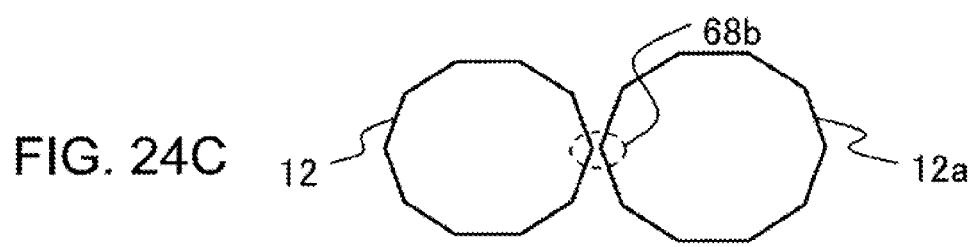
FIG. 24C is a plan view illustrating a variation in the shape of the protrusion when looked from above the surface of the semiconductor device.
Figure 24D:
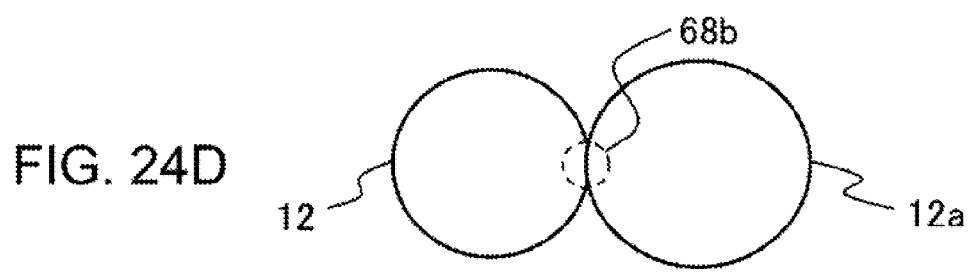
FIG. 24D is a plan view illustrating a variation in the shape of the protrusion when looked from above the surface of the semiconductor device.

The cross-sectional shape of each protrusion 12 (cross-sectional shape in parallel to the semiconductor substrate 10) explained by reference to FIGS. 1 and 2 is quadrilateral (FIG. 24A). However, the cross-sectional shape of the protrusion 12 may be different therefrom. For example, the cross-sectional shape of the protrusion 12 may be octagonal, decagonal, dodecagonal or circular.

When the cross-sectional shape of the protrusion 12 is quadrilateral or octagonal (FIGS. 24A and 24B), the protrusion 12 of the semiconductor device 2 is adjacent to the protrusion 12 of the other semiconductor device 2a in a wide area 68a along one side of the cross sections. On the other hand, when the cross-sectional shape of the protrusion 12 is decagonal (FIG. 24C) or circular (FIG. 24D), the protrusion 12 of the semiconductor device 2 is adjacent to the protrusion 12 of the other semiconductor device 2a only in a quite narrow area 68b. Even when the protrusions are adjacent to each other in such a quite narrow area 68b, the bonding material creeps up to the second bonding portion in such a quite narrow area 68b, and the bonding strength between the semiconductor device 2 and the semiconductor device 2a is reinforced.

Incidentally, irrespective of whether the mutual protrusions are adjacent in the wide area 68a or the narrow area 68b, no other bonding portion lies between the second bonding portion (bonding portion on the side face of the protrusion) of the semiconductor device 2 and the second bonding portion of the other semiconductor device 2a. In other words, when the semiconductor device 2 is bonded to the other semiconductor device 2a, the second bonding portion of the semiconductor device 2 is adjacent to the bonding portion of the other semiconductor device 2a.

Figure 24E:
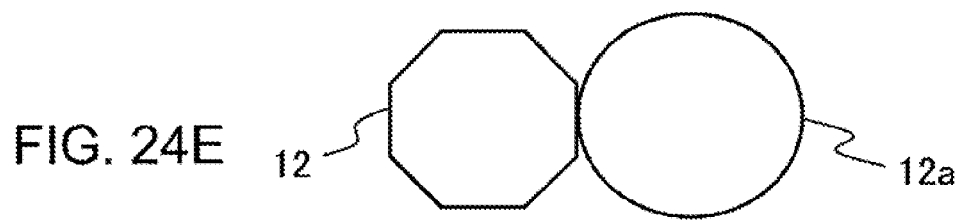
FIG. 24E is a plan view illustrating a variation in the shape of the protrusion when looked from above the surface of the semiconductor device.

Further, as illustrated in FIG. 24E, the protrusion 12 of the semiconductor device 2 may have a different cross-sectional shape from that of the protrusion 12a of the other semiconductor device 2a.

Embodiment 2

Figure 25A:
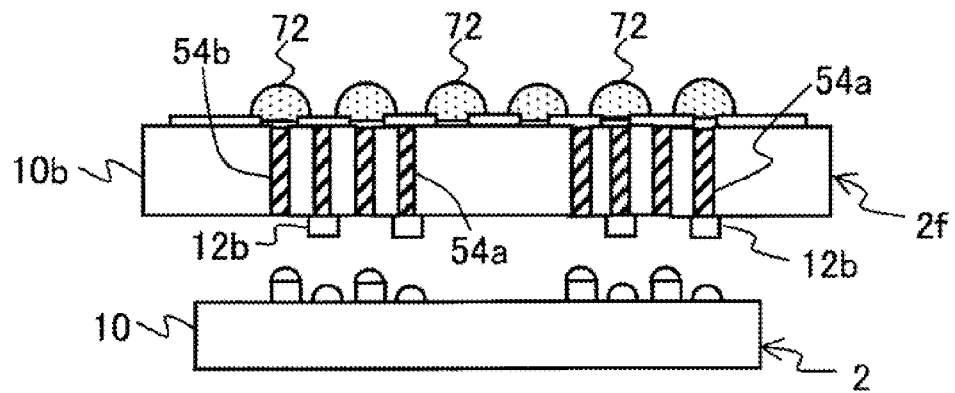
FIG. 25A illustrate a cross section explaining a multichip semiconductor device according to the embodiment 2.
Figure 25B:
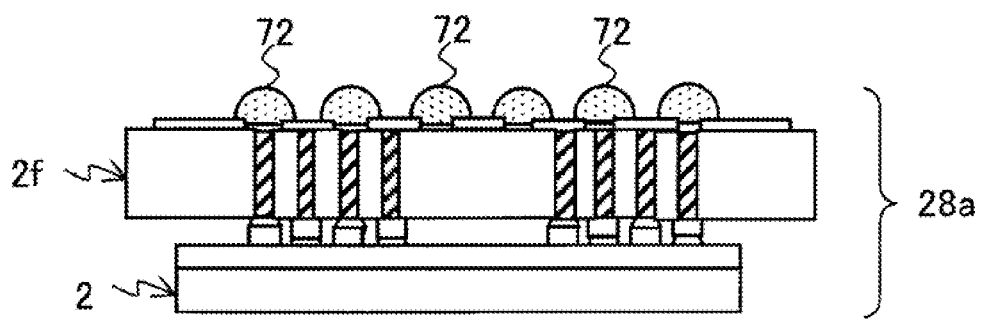
FIG. 25B illustrate a cross section explaining a multichip semiconductor device according to the embodiment 2.
Figure 25C:
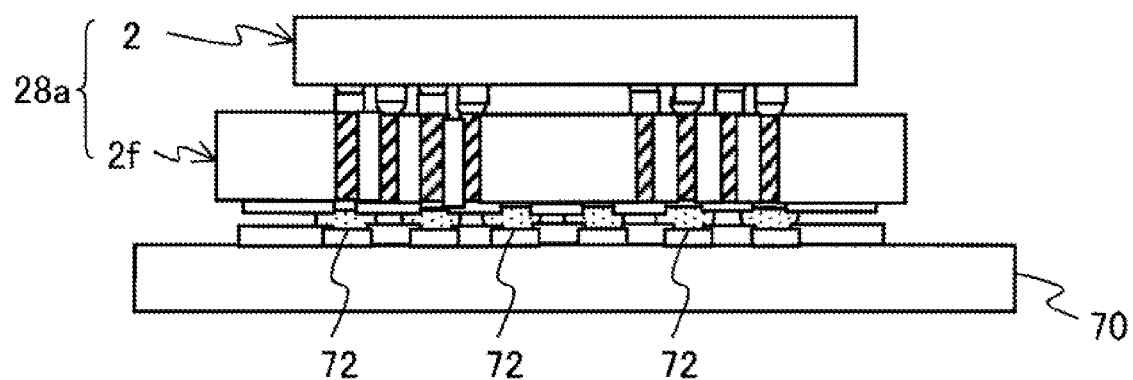
FIG. 25C illustrate a cross section explaining a multichip semiconductor device according to the embodiment 2.

FIGS. 25A-25C illustrate cross sections explaining a multichip semiconductor device 28a according to the present embodiment. Description of portions in common with the embodiment 1 will be omitted hereafter.

As illustrated in FIG. 25A, the multichip semiconductor device 28a according to the present embodiment includes a first semiconductor device 2 and a second semiconductor device 2f. The first semiconductor device 2 is identical to the semiconductor device 2 explained in the embodiment 1. On the other hand, the second semiconductor device 2f includes a semiconductor substrate 10b having an internal circuit, such as an integrated circuit, disposed on the surface thereof.

Figure 26:
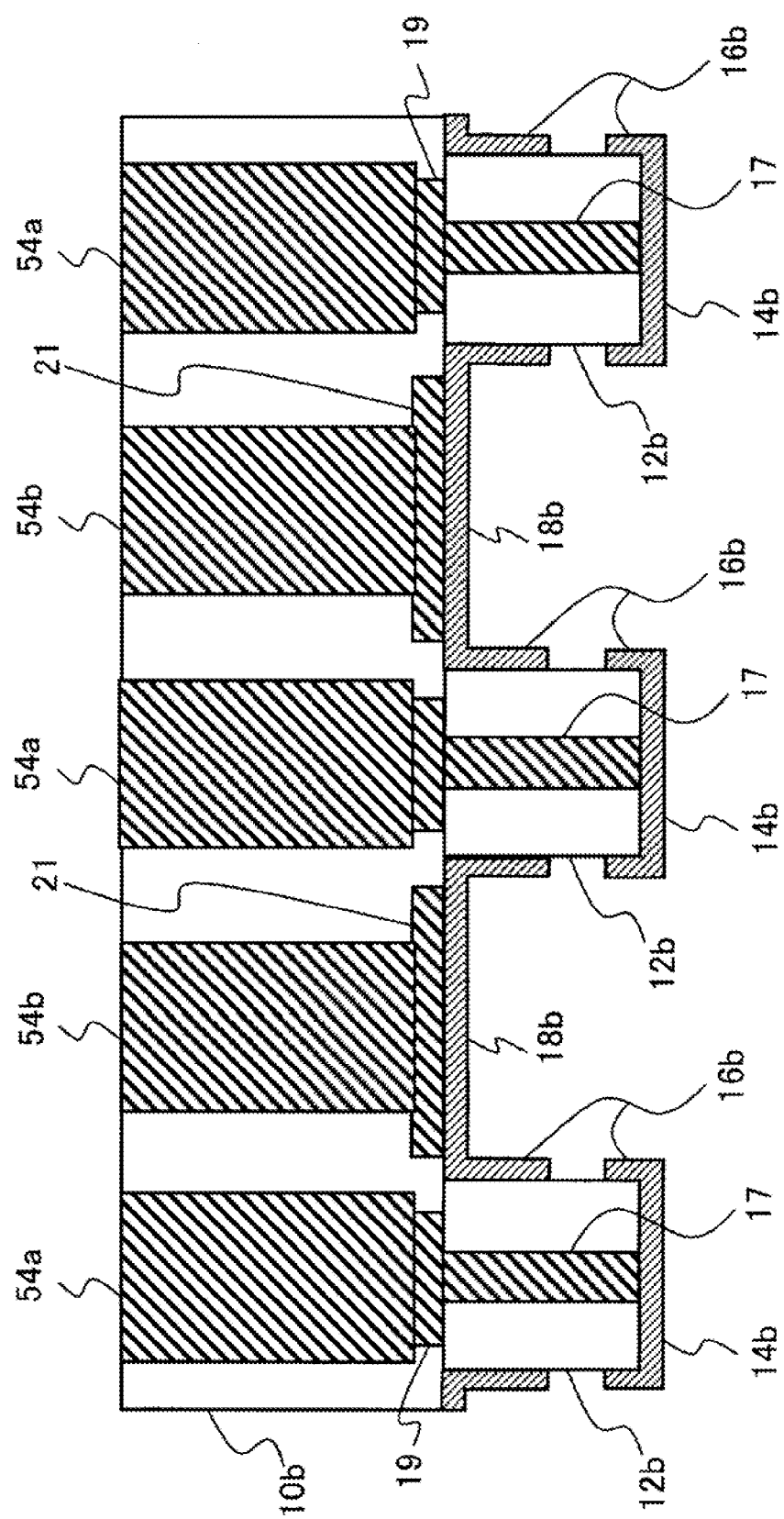
FIG. 26 is a partial enlarged view in the vicinity of the rear face of the semiconductor substrate.

FIG. 26 is a partial enlarged view in the vicinity of the rear face of the semiconductor substrate 10b. On the rear face of the semiconductor substrate 10b, a plurality of protrusions 12b and first to third bonding portions 14b, 16b, 18b are provided, similar to the surface of the semiconductor device 2 (FIG. 2).

Further, each first bonding portion 14b is connected to the internal circuit of the second semiconductor device 2f, through a conductor 54a, which is disposed in a via hole passing through the semiconductor substrate 10b, and a conductor 17 passing through a protrusion 12b. Hereafter, a via hole passing through the semiconductor substrate is referred to as through substrate via hole.

Also, each third bonding portion 18b provided between the protrusions 12b is connected to the internal circuit of the second semiconductor device 2f, through a conductor 54b disposed in the through substrate via hole.

FIG. 25B is a cross section of the multichip semiconductor device 28a in which the first semiconductor device 2 is bonded to the second semiconductor device 2f. Similar to the multichip semiconductor device 28 of the embodiment 1, the first semiconductor device 2 and the second semiconductor device 2f are bonded together by the first to the third bonding portions 14b, 16b, 18b via a bonding material.

FIG. 25C illustrates a state of the multichip semiconductor device 28a mounted on a package substrate 70. As illustrated in FIG. 25C, the multichip semiconductor device 28a is bonded to the package substrate 70 by bumps 72 provided on the surface of the second semiconductor device 2f. On the rear face of the package substrate 70, for example, a ball grid array (not illustrated) is provided. The second semiconductor device 2f is connected to the ball grid array through conductors passing through the package substrate 70.

Figure 27A:
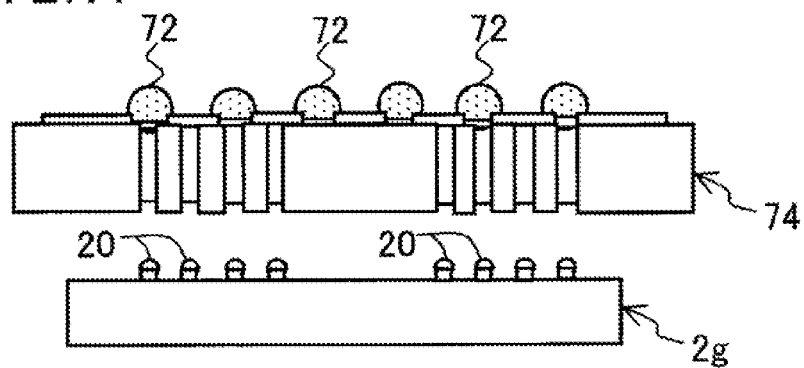
FIG. 27A is a cross section explaining a deformed example of the multichip semiconductor device.
Figure 27B:
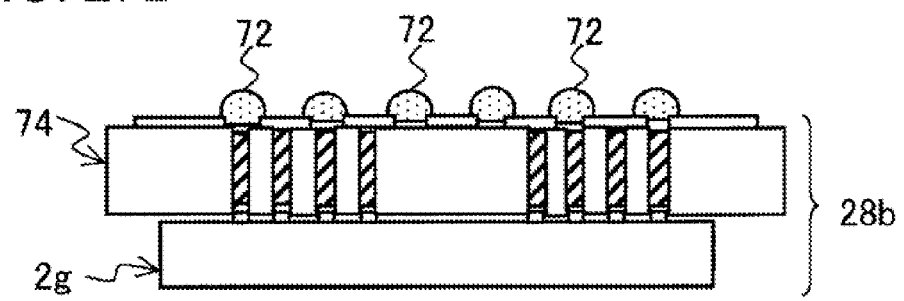
FIG. 27B is a cross section explaining a deformed example of the multichip semiconductor device.
Figure 27C:
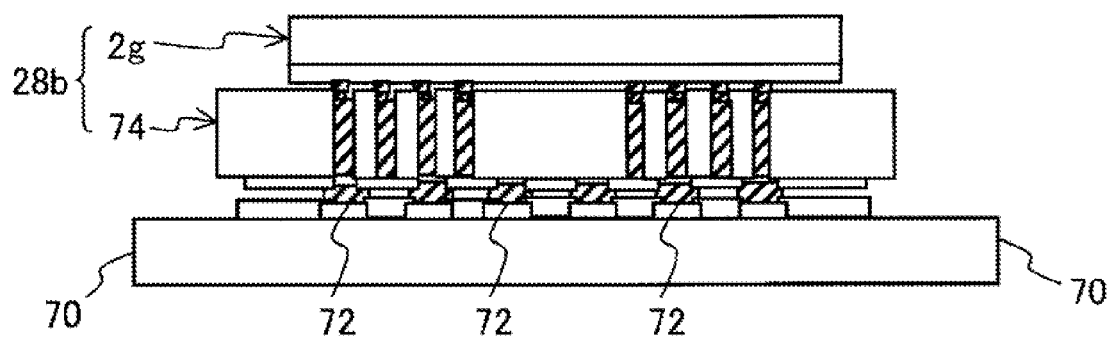
FIG. 27C is a cross section explaining a deformed example of the multichip semiconductor device.

FIGS. 27A-27C are cross sections explaining a deformed example 28b of the multichip semiconductor device 28a. As illustrated in FIG. 27A, the deformed example 28b includes a third semiconductor device 2g and a fourth semiconductor device 74.

The third semiconductor device 2g does not include third bonding portions 18, differently from the semiconductor device 2 according to the embodiment 1. Other structure is substantially identical to the structure of the semiconductor device 2 of the embodiment 1.

Different from the second semiconductor device 21, in the fourth semiconductor device 74, protrusion 12b, first bonding portion 14b, second bonding portion 16b and third bonding portion 18b are not provided. Other structure is substantially identical to the structure of the second semiconductor device 2f.

Figure 28:
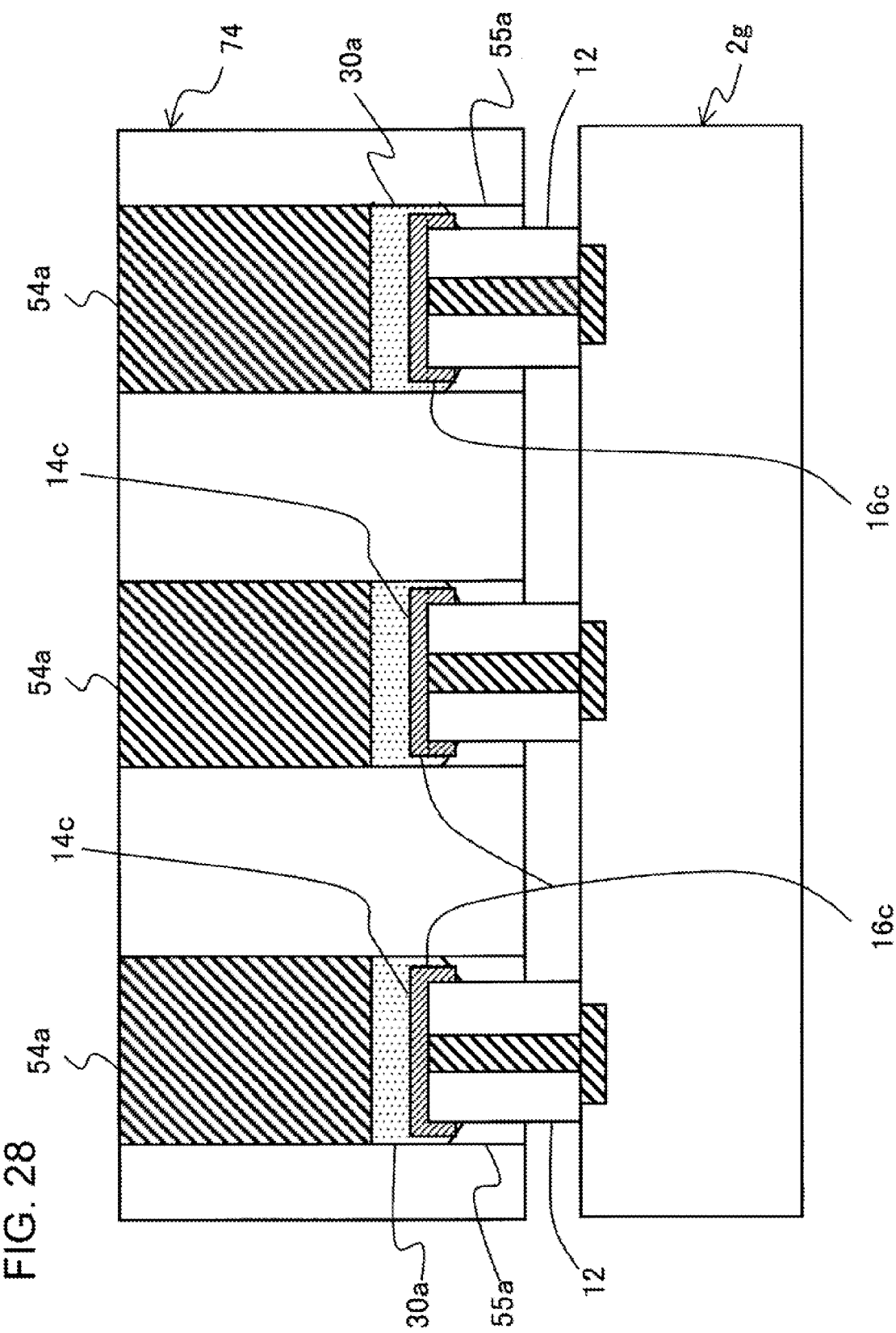
FIG. 28 is a partial enlarged view in the vicinity of each bonding portion of the multichip semiconductor device.

FIG. 27B is a cross section of the multichip semiconductor device 28b in which the third semiconductor device 2g is bonded to the fourth semiconductor device 74. FIG. 28 is a partial enlarged view in the vicinity of each bonding portion of the multichip semiconductor device 28b. As illustrated in FIGS. 27B and 28, a protrusion 12 of the third semiconductor device 2g is fit to a silicon penetrating via hole 55a of the fourth semiconductor device 74. A first bonding portion 14c of the third semiconductor device 2g is bonded to a conductor 54a, provided in the through substrate via hole 55a, by a bonding material 30a (bump 20 provided on the first bonding portion).

FIG. 27C illustrates a state of the multichip semiconductor device 28b mounted on the package substrate 70. The multichip semiconductor device 28b is bonded to the package substrate 70 by each bump 72 provided on the surface of the fourth semiconductor device 74.

Additionally, the third semiconductor device 2g is formed by removing the conductive film 50a between the protrusions 12, before the formation of the bump 20 in the manufacturing method of the semiconductor device 2 according to the embodiment 1, for example. Namely, in the manufacturing method of the third semiconductor device 2g, the first bonding portion and the second bonding portion (conductive bonding portion) are formed on the upper portion and the side face of the protrusion 12 (pillar-shaped insulator).

Embodiment 3

Figure 29:
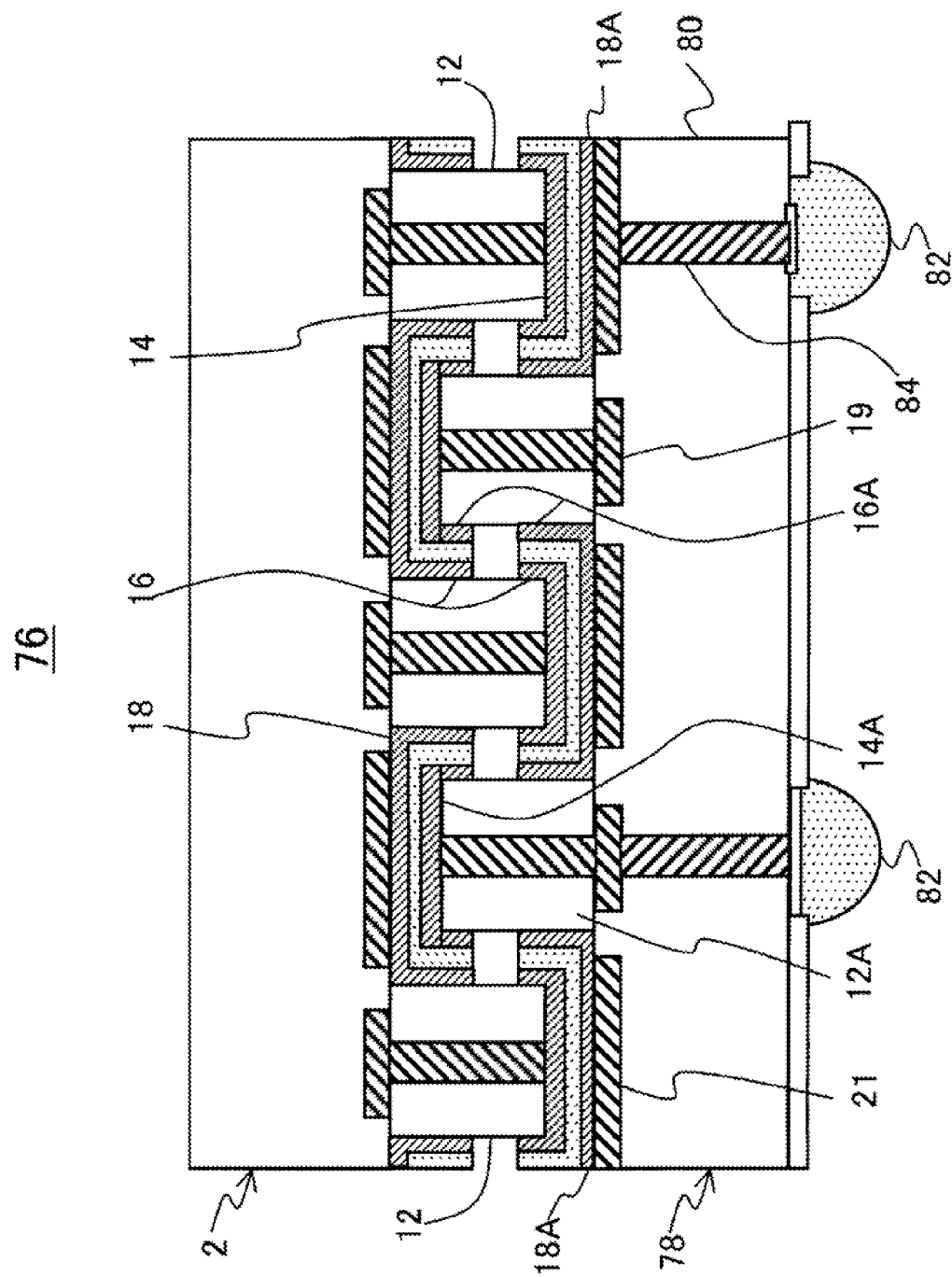
FIG. 29 is a partial cross section of a device according to the embodiment 1.

FIG. 29 is a partial cross section of a device 76 according to present embodiment.

As illustrated in FIG. 29 for example, the device 76 includes a semiconductor device 2 (FIG. 2) according to the embodiment 1 and a substrate 78. Hereafter, the protrusion 12 of the semiconductor device 2 is referred to as a first protrusion.

The substrate 78 includes a flat substrate 80 and a plurality of second protrusions 12A formed on the surface (first surface) of the flat substrate 80. The substrate 78 further includes fourth bonding portions 14A formed on the upper portions of the plurality of second protrusions 12A, fifth bonding portions 16A formed on the side faces of the plurality of second protrusions 12A, and a plurality of sixth bonding portions 18A formed on the surface of the flat substrate 80 between the plurality of second protrusions 12A.

Further, the substrate 78 includes a ball grid array 82 disposed on the rear face of the flat substrate 80 and penetrating conductors 84 connected to the ball grid array 82. Here, the flat substrate 80 is a package substrate, a silicon interposer or the like.

Further, in the device 76, the semiconductor device 2 and the substrate 78 are bonded together in a state that the second bonding portions 16 and the fifth bonding portions 16A, respectively provided on the plurality of first protrusions 12 and the plurality of second protrusions 12A oppositely disposed at the side faces, are adjacent to each other.

Thus, in the device 76 according to the present embodiment, bonding strength between the semiconductor device 2 and the substrate 80 is enhanced, similar to the multichip semiconductor device 28 explained by reference to FIG. 5.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a plurality of protrusions formed on a first face of the semiconductor device;
first conductive bonding portions formed on upper portions of the plurality of protrusions;
second conductive bonding portions formed on side faces of the plurality of protrusions; and
third conductive bonding portions formed on the first face between the plurality of protrusions,
wherein the second conductive bonding portions are separated into upper portion sides and lower portion sides of the plurality of protrusions, each one of the upper portion sides is connected to each one of the first conductive bonding portions, each one of the lower portion sides is connected to at least one of the third conductive bonding portions,
the plurality of protrusions are formed of insulator, and
the first bonding portions are connected to an internal circuit of the semiconductor device through conductors passing through the plurality of protrusions and isolated from the lower portion sides,
wherein the semiconductor device is configured to bond to an other semiconductor device through the third from the first bonding portions.

2. The semiconductor device according to claim 1, wherein the semiconductor device is bonded to the other semiconductor device through protruding electrode formed on each the first bonding portions.

3. A multichip semiconductor device comprising:
a first semiconductor device and a second semiconductor device each including a plurality of protrusions formed on a first face of each semiconductor device, first conductive bonding portions formed on upper portions of the plurality of protrusions, second conductive bonding portions formed on side faces of the plurality of protrusions, and third conductive bonding portions formed on the first face between the plurality of protrusions,
wherein the second conductive bonding portions are separated into upper portion sides and lower portion sides of the plurality of protrusions, each one of the upper portion sides is connected to each one of the first conductive bonding portions, each one of the lower portion sides is connected to at least one of the third conductive bonding portions,
the plurality of protrusions are formed of insulator, and
the first bonding portions are connected to an internal circuit of the semiconductor device through conductors passing through the plurality of protrusions and isolated from the lower portion sides,
wherein the first semiconductor device and the second semiconductor device are bonded together in a state that the respective second bonding portions provided on the plurality of protrusions disposed to face each other are adjacent to each other.

4. The multichip semiconductor device according to claim 3,
wherein the third bonding portions of the second semiconductor device are connected to an internal circuit of the second semiconductor device through conductors provided in through substrate via holes.

5. The multichip semiconductor device according to claim 3, wherein the respective upper portion sides of the second bonding portions of the first semiconductor device and the second semiconductor device are bonded to the respective lower portion sides portions of the first semiconductor device and the second semiconductor device by a bonding material; and, configured to form insulating gaps between adjacent first bonding portions and third bonding portions.

* * * * *